(12) United States Patent
Yoshida et al.

(10) Patent No.: US 7,946,805 B2
(45) Date of Patent: May 24, 2011

(54) FAN UNIT INCLUDING TAPERED AIRFLOW PASSAGE

(75) Inventors: Yusuke Yoshida, Kyoto (JP); Satoru Hanaoka, Kyoto (JP)

(73) Assignee: Nidec Corporation, Kyoto (JP)

( * ) Notice: Subject to any disclaimer, the term of this patent is extended or adjusted under 35 U.S.C. 154(b) by 929 days.

(21) Appl. No.: 11/831,240

(22) Filed: Jul. 31, 2007

(65) Prior Publication Data

US 2008/0031722 A1   Feb. 7, 2008

(30) Foreign Application Priority Data

Aug. 2, 2006   (JP) ................. 2006-210511

(51) Int. Cl.
F01D 1/24 (2006.01)
F04D 25/16 (2006.01)
F04D 19/02 (2006.01)
F04D 13/06 (2006.01)

(52) U.S. Cl. ....... 415/66; 415/220; 415/219.1; 416/128; 416/198 R

(58) Field of Classification Search ................ 415/66, 415/211.2, 220, 22, 68, 219.1; 416/120, 416/128, 198 R
See application file for complete search history.

(56) References Cited

U.S. PATENT DOCUMENTS

| 2,339,602 A | * | 1/1944 | Hagen ................. 416/201 R |
| 2,384,000 A | * | 9/1945 | Wattendorf ................. 415/192 |
| 7,156,611 B2 | | 1/2007 | Oosawa et al. |

FOREIGN PATENT DOCUMENTS

| CN | 2406089 Y | 11/2000 |
| JP | 2002-344182 A | 11/2002 |
| JP | 2004-278370 A | 10/2004 |
| JP | 2004-278371 A | 10/2004 |

* cited by examiner

Primary Examiner — Ninh H Nguyen
Assistant Examiner — Jesse Prager
(74) Attorney, Agent, or Firm — Keating & Bennett, LLP

(57) ABSTRACT

An axial fan unit includes two or more impellers which rotate about a center axis in opposite directions relative to each other to create an axial airflow. Each impeller includes a hub and a plurality of blades disposed around the hub. The impellers are surrounded by a housing in a radial direction that is perpendicular or substantially perpendicular to the center axis. On a cross-sectional plane of the axial fan unit including the center axis, a distance between the hubs of the impellers and the housing decreases from an upstream side to a downstream side in a direction of the axial airflow.

17 Claims, 14 Drawing Sheets

FAN UNIT INCLUDING TAPERED AIRFLOW PASSAGE

BACKGROUND OF THE INVENTION

1. Field of the Invention

The present invention relates to an axial fan unit in which two or more fans are connected coaxially with each other.

2. Description of the Related Art

Electronic devices having frames, e.g., personal computers and servers, include cooling fans therein. The cooling fans are used for cooling electronic components inside the frames. When density of the electronic components inside the frames increases, concentration of heat generated by the electronic components occurs and lowers performances of the electronic components. In order to prevent this, cooling fans are required to have improved performances.

Among various types of electronic devices, relatively large sized electronic devices, e.g., servers larger than typical personal computers, require cooling fans which can achieve both a high static pressure and a large flow rate of air. One example of such cooling fans is an axial fan unit formed by at least two fans connected coaxially with each other. Japanese Unexamined Patent Publication No. 2004-278371 and its counter part U.S. Pat. No. 7,156,611 disclose a contra-rotating axial fan unit in which two impellers rotating in opposite directions to each other are coaxially arranged in a housing.

SUMMARY OF THE INVENTION

According to preferred embodiments of the present invention, an axial fan unit is provided. The axial fan unit includes a first impeller having a first hub centered on a center axis and a plurality of first blades disposed about the center axis outside the first hub in a radial direction perpendicular to or substantially perpendicular to the center axis. A first motor is disposed in the first hub and can rotate the first impeller about the center axis to create a first airflow which flows generally axially. A second impeller is disposed downstream of the first impeller in a direction of the first airflow coaxially with the first impeller. The second impeller has a second hub and a plurality of second blades disposed about the center axis outside the second hub in the radial direction. A second motor is disposed in the second hub and is operable to rotate the second impeller about the center axis to create a second airflow which flows in the same direction as the first airflow. A housing is disposed to radially surround the first and second impellers. When the axial fan unit is viewed along the center axis, a cross-sectional area of a region surrounded by an outer side surface of the second hub and an inner surface of the housing at a downstream end of the second hub in the direction of the first and second airflows is smaller than a cross-sectional area of a region surrounded by an outer side surface of the first hub and the inner surface of the housing at a downstream end of the first hub and a cross-sectional area of a region surrounded by the outer side surface of the second hub and the inner surface of the housing at an upstream end of the second hub.

According to other preferred embodiments of the present invention, an axial fan unit is provided. In the axial fan unit, two or more impellers are disposed which rotate about a center axis in opposite directions relative to each other to create an axial airflow. Each of the impellers includes a hub and a plurality of blades disposed around the hub. A housing of the axial fan unit surrounds the two or more impellers in a radial direction substantially perpendicular to the center axis. On a plane including the center axis, a distance between the hubs of the two or more impellers and the housing decreases from an upstream side to a downstream side in a direction of the axial airflow.

According to the preferred embodiments of the present invention, it is possible to reduce decreases in a flow rate of air which occurs while air flows through a passage from an air inlet of the fan unit to an air outlet.

Other features, elements, advantages and characteristics of the present invention will become more apparent from the following detailed description of preferred embodiments thereof with reference to the attached drawings.

DETAILED DESCRIPTION OF PREFERRED EMBODIMENTS

Figure 1:
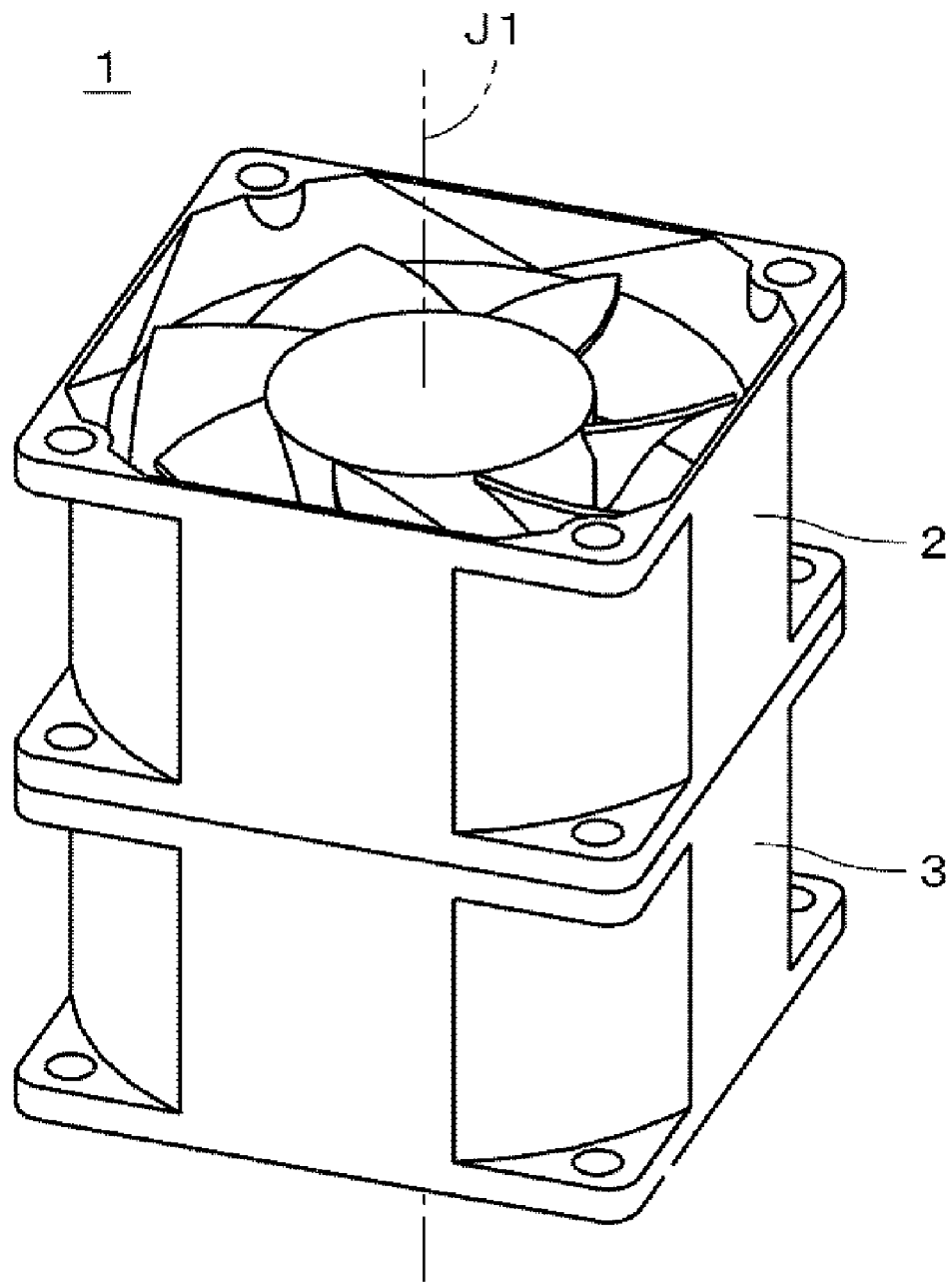
FIG. 1 is a perspective view of an axial fan unit according to a first preferred embodiment of the present invention.

Referring to FIGS. 1 through 14, preferred embodiments of the present invention will be described in detail. It should be noted that in the explanation of the present invention, when positional relationships among and orientations of the different components are described as being up/down or left/right, ultimately positional relationships and orientations that are in the drawings are indicated; positional relationships among and orientations of the components once having been assembled into an actual device are not indicated. Meanwhile, in the following description, an axial direction indicates a direction parallel to a rotation axis, and a radial direction indicates a direction perpendicular to the rotation axis.

In typical axial fan units, an axial length of a passage of an airflow inside the housing is longer than that in a single axial fan. That is, a ratio of the axial length of the passage to an impeller diameter is much larger in the axial fan units than in the single axial fan. While air flows in the passage in the housing toward an air outlet of the axial fan unit, the velocity of air is reduced because of friction between the air and the inner surface of the housing, friction caused by air viscosity, or the like. As the axial length of the passage becomes longer, the air velocity is reduced to a great degree. This results in lowering of a flow rate of air at the air outlet of the axial fan unit. The inventor of the present application has studied how to prevent the lowering of the flow rate and has developed the preferred embodiments of the present invention.

First Preferred Embodiment

FIG. 1 is a perspective view of an axial fan unit 1 according to a first preferred embodiment of the present invention. The axial fan unit 1 includes two axial fans coaxially connected to each other.

Figure 2:
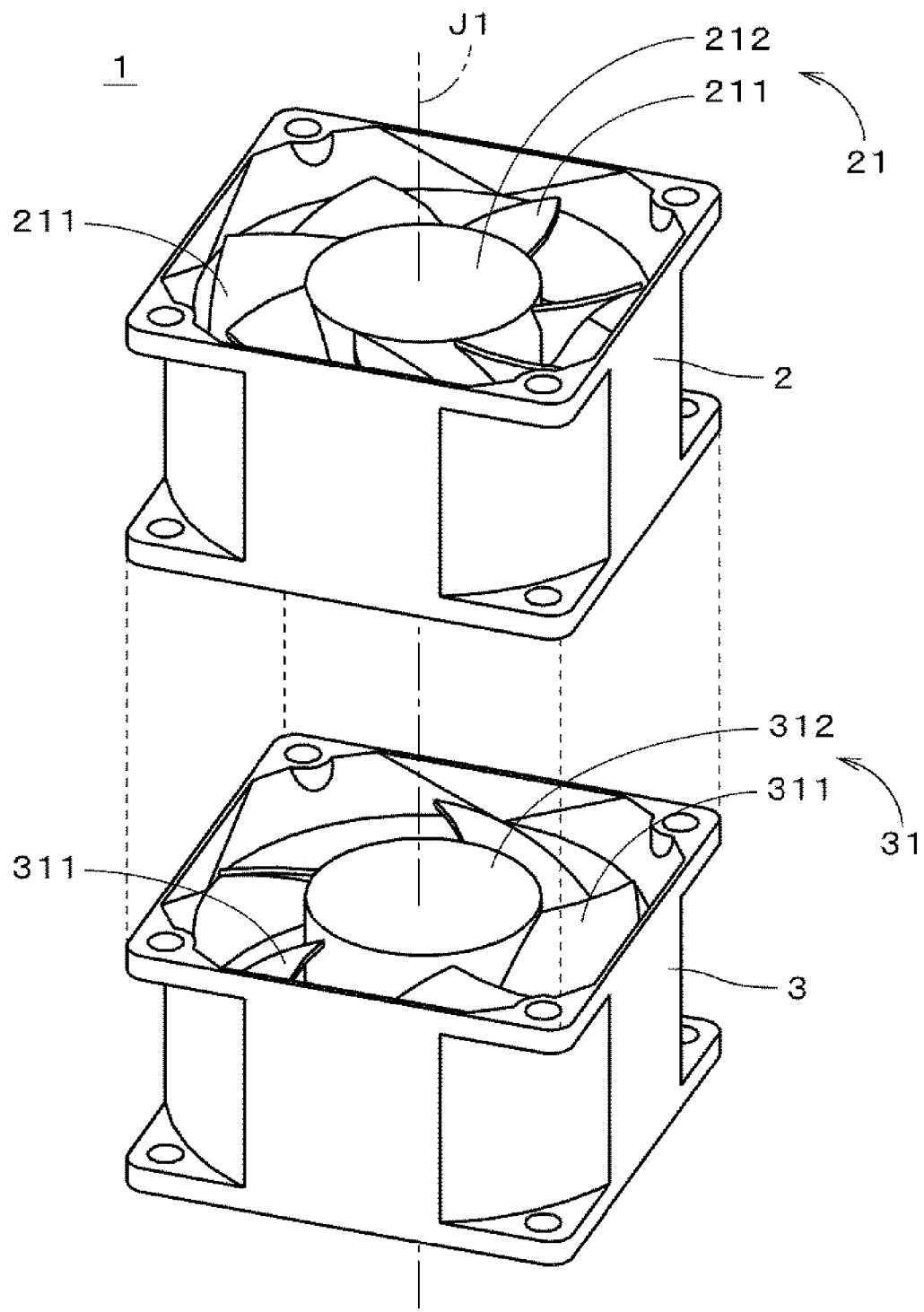
FIG. 2 shows first and second axial fans of the axial fan unit of FIG. 1, which are separated from each other.

FIG. 2 shows the two axial fans which are separated from each other in an axial direction parallel or substantially parallel to a center axis J1 of the two axial fans. The axial fan unit 1 of this preferred embodiment can be used for cooling the inside of an electronic device such as a server.

As shown in FIG. 1, the axial fan unit 1 includes a first axial fan 2 and a second axial fan 3 which is disposed coaxially with the first axial fan 2. In the example of FIG. 1, the first axial fan 2 is located axially above the second axial fan 3. The first and second axial fans 2 and 3 are secured to each other, for example, by screwing (not shown).

The axial fan unit 1 of this preferred embodiment is a so-called contra-rotating fan in which a first impeller 21 of the first axial fan 2 and a second impeller 31 of the second axial fan 3 rotate about the center axis J1 in opposite directions relative to each other. The rotation of the first and second impellers 21 and 31 creates an airflow flowing from the first axial fan 2 toward the second axial fan 3. In other words, an axially downward flow in FIG. 1 is created. In the following description, the upper side in FIG. 1 from which air is taken in (i.e., the first axial fan 2 side) is referred to as an air-inlet side, and the lower side in FIG. 1 from which air is discharged from the axial fan unit 1 (i.e., the second axial fan 3 side) is referred to as an air-outlet side. In the axial fan unit 1 of this preferred embodiment, since the first and second impellers 21 and 31 (see FIG. 2) rotate about the center axis J1 in opposite directions relative to each other, a higher static pressure and a higher flow rate of air can be obtained than those obtained in an axial fan unit in which two impellers rotate about the center axis J1 in the same direction as each other.

Figure 3:
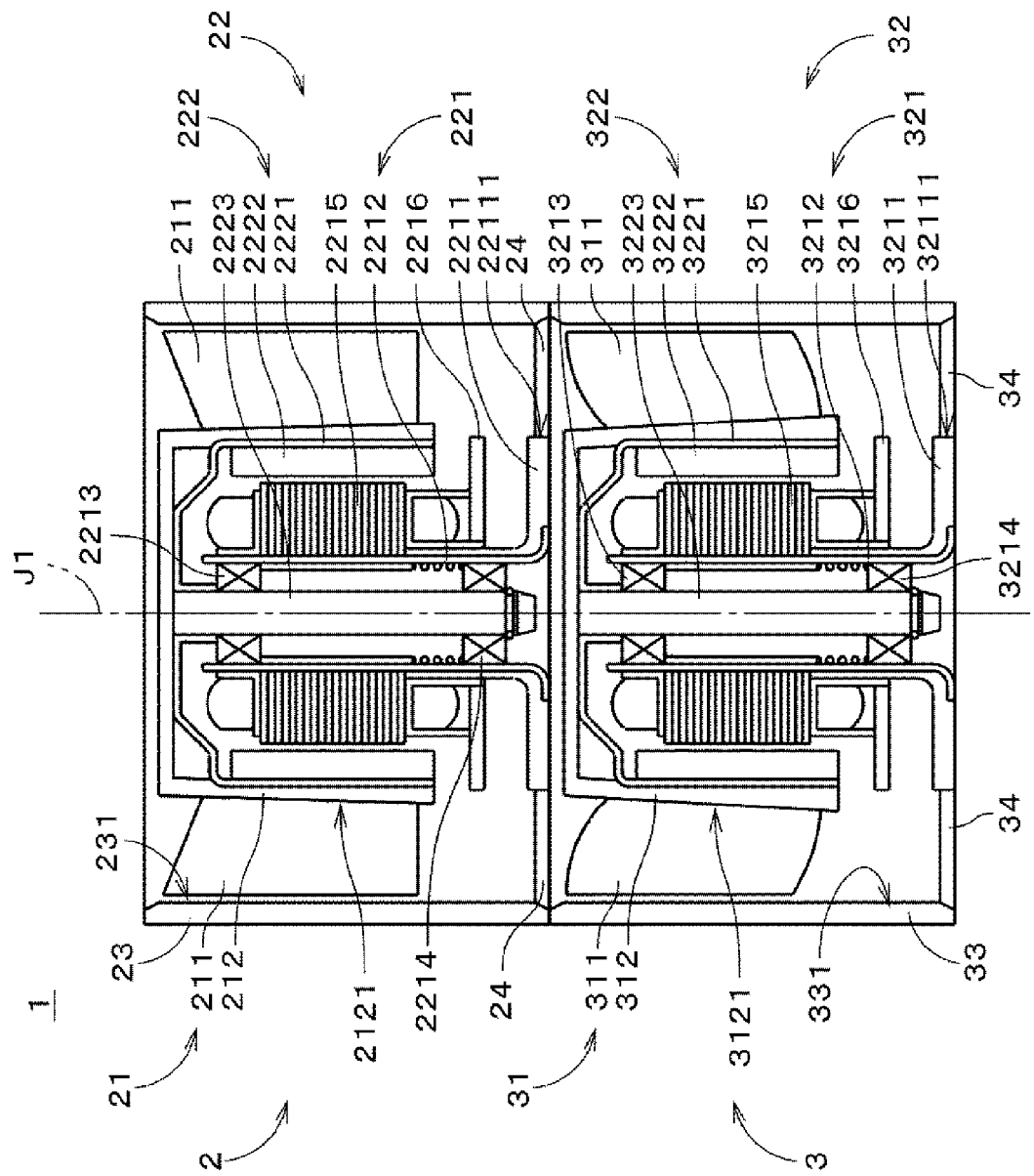
FIG. 3 is a cross-sectional view of the axial fan unit of FIG. 1, taken along a plane including its center axis.
Figure 4:
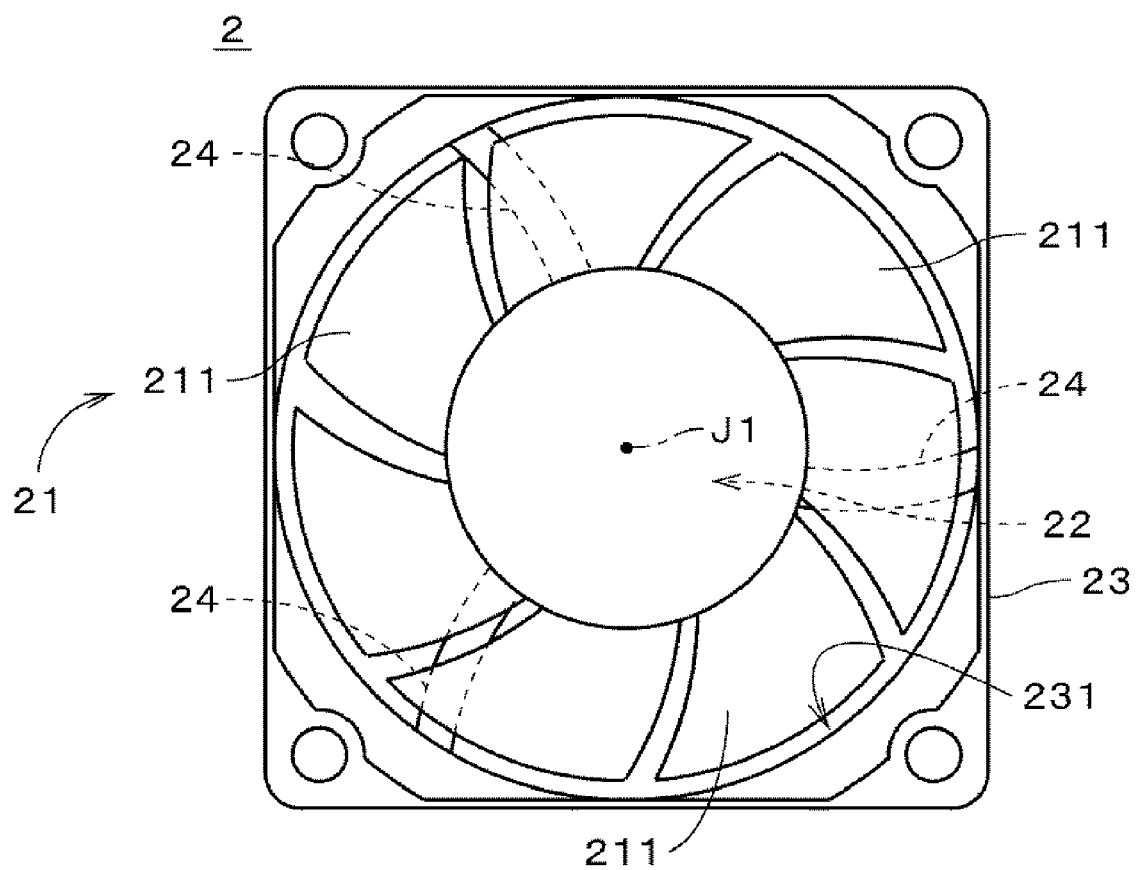
FIG. 4 is a plan view of the first axial fan of the axial fan unit of FIG. 1.

FIG. 3 is a cross-sectional view of the axial fan unit 1, taken along a plane including the center axis J1. FIG. 4 is a plan view of the first axial fan 2 when viewed from the air-inlet side in the axial direction. Referring to FIGS. 3 and 4, the first axial fan 2 includes the first impeller 21, a first motor 22, a first housing piece 23, and a plurality of first ribs 24. The first impeller 21 has a plurality of first blades 211 disposed about the center axis J1 at regular circumferential intervals. The first blades 211 extend outward in a radial direction perpendicular to or substantially perpendicular to the center axis J1. In the illustrated example, preferably seven first blades 211 are regularly arranged about the center axis J1. The first motor 22 rotates the first impeller 21 about the center axis J1 in a clockwise direction in FIGS. 3 and 4, when viewed from the air-inlet side in the axial direction. The rotation of the first impeller 21 creates an airflow flowing from the air-inlet side to the air-outlet side generally along the center axis J1. The first housing piece 23 has an inner surface 231 defining a space therein. The first housing piece 23 radially surrounds the first impeller 21 and the first motor 22. In this preferred embodiment, the first housing piece 23 is hollow and generally cylindrical. The first ribs 24 are provided on the air-outlet side of the first impeller 21 in the axial direction, i.e., axially between the first impeller 21 and the second impeller 31. The first ribs 24 extend from the first motor 22 radially outward and are connected to the inner surface 231 of the first housing piece 23. In the illustrated example, preferably three first ribs 24 are provided.

FIG. 3 merely shows general cross-sectional shapes of the first blade 211 and the first supporting rib 24 when viewed in the radial direction for the sake of convenience. Parallel diagonal lines to be used for showing a cross section of a part in a typical cross-sectional view are omitted for components of the first motor 22 in FIG. 3. These are the same for the second axial fan 3 described later. That is, in FIG. 3, general cross-sectional shapes of a second blade 311 of the second impeller 31 and a second supporting rib 34 when viewed in the radial direction are shown and parallel diagonal lines are omitted for components of a second motor 32. (This is also applied to FIG. 7.)

Referring to FIG. 3, the first motor 22 includes a stationary portion 221 (described later) and a rotor 222. The rotor 222 is supported by a bearing assembly described later so as to be rotatable about the center axis J1 with its inner side surface radially facing the stationary portion 221. Although the center axis J1 is arranged to be coincident with a direction of gravity in the illustrated example, it is not always necessary that the center axis J1 is not parallel to the direction of gravity.

The stationary portion 221 includes a first base portion 2211 which supports other components of the stationary portion 221. In this preferred embodiment, the first base portion 2211 is in the form of a generally circular plate and has an opening at its center, when viewed in the axial direction. The first base portion 2211 is secured to the inner surface 231 of the first housing piece 23 with the first ribs 24 extending radially outwardly as shown in FIGS. 3 and 4. To an outer side surface 22111 of the first base portion 2211 are connected center-axis J1 side ends of the first ribs 24. In this preferred embodiment, the first base portion 2211, the first ribs 24, and the first housing 24 are made of resin, and are formed integrally with one another, for example, by injection molding.

To a portion of the first base portion 2211, which defines the center opening, is secured a bearing holder 2212 axially projecting from the first base portion 2211 upward in FIG. 3 and defining a space therein. In this preferred embodiment, the bearing holder 2212 is hollow and generally cylindrical. Ball bearings 2213 and 2214 which form a portion of the bearing assembly are provided axially separately from each other in the bearing holder 2212, for example, at positions near axially upper and lower ends of the bearing holder 2212, respectively. More specifically, the ball bearings 2213 and 2214 are secured to an inner side surface of the bearing holder 2212.

The stationary portion 221 includes an armature 2215 attached to the outer side surface of the bearing holder 2212 and the outer side surface of the bearing holder 2212. Moreover, a circuit board 2216, for example, in the form of a generally circular plate, is disposed axially below the armature 2215. In other words, the circuit board 2216 is disposed axially between the armature 2215 and the first base portion 2211, as shown in FIG. 3. The circuit board 2216 has a circuit (not shown) which is electrically connected to the armature 2215 and controls the armature 2215. The circuit board 2216 is also electrically connected to a power supply provided outside the axial fan unit 1 via a bundle of conductive wires, although the power supply and the bundle of conductive wires are not shown in FIG. 3.

The rotor 222 includes a hollow yoke 2221 centered on the center axis J1 and having a lid-like member. The yoke 2221 is made of magnetic metal. The rotor 222 also includes a magnet 2222 secured on an inner side surface of the yoke 2221 to radially face the armature 2215. In this preferred embodiment, the yoke 2221 is hollow and generally cylindrical. A shaft 2223 extends from the lid-like member of the yoke 2221 axially downward, i.e., toward the first base portion 2111. The shaft 2223 is inserted into the bearing holder 2212 along the center axis J1 and is supported in a rotatable manner by the bearing holder 2213 and 2214. In this manner, the shaft 2223 and the ball bearings 2213 and 2214 define the bearing assembly for supporting the yoke 2221 in a rotatable manner about the center axis J1 relative to the first base portion 2211.

The first impeller 21 includes a first hub 2212 and a plurality of first blades 211. The first hub 212 is hollow and centered on the center axis J1, and has a lid-like member at one axial end and is open at the other axial end. In this preferred embodiment, the first hub 212 is generally cylindrical. The first hub 212 covers the outer side surface and the lid-like member of the yoke 2221 of the first motor 22. The first blades 211 are provided on an outer side surface 2121 of the first hub 212 regularly about the center axis J1. That is, the first blades 211 are disposed about the center axis J1 at regular circumferential intervals. The first blades 211 extend radially outward from the outer side surface 2121 of the first hub 212. In this preferred embodiment, the first hub 212 and the first blades 211 are made of resin. It is preferable to form the first hub 212 and the first blades 211 integrally with each other, for example, by injection molding. In the first axial fan 2, the stationary portion 221 and the rotor 222 forming the first motor are partially disposed in the first hub 212 of the first impeller 21.

Referring to FIG. 3, an outer diameter of the first hub 212 increases from the air-inlet side to the air-outlet side in the axial direction. In this preferred embodiment, the outer side surface 2121 of the first hub 212 is formed by a portion of a conical surface whose apex is located on the center axis J1 and which is centered on the center axis J1. On the other hand, an inner diameter of the first housing piece 23 is substantially constant in a region where the outer side surface 2121 of the first hub 212 radially faces the inner surface 231 of the first housing piece 23.

In actual products of the axial fan unit 1, a portion of the inner surface 231 of the first housing piece 23 is inclined with respect to the center axis J1 at an angle in order to allow easy removal of the first housing piece 23 from a die in the axial direction. This angle is called as a draft angle. More specifically, a portion of the inner surface 231 of the first housing piece 23 adjacent to each axial end thereof is inclined with respect to the center axis J1 in a direction away from the center axis J1. Therefore, in the region where the outer side surface 2121 of the first hub 212 radially faces the first housing piece 23, the inner diameter of the first housing piece 23 is not precisely constant but is generally or substantially constant. However, the draft angle is very small, e.g., about 1 degree or less (please note the draft angle is changed in accordance with the design of the housing but is not zero). Thus, the inner diameter of the first housing piece 23 in the region where the first housing piece 23 radially faces the outer side surface 2121 of the first hub 212 can be regarded as being substantially constant. This is the same for the second housing 33 of the second axial fan 3 described later.

With this structure, a cross-sectional area of a passage of an airflow on a plane perpendicular to the center axis J1 is lower at the air-outlet side end of the first hub 212 than at the air-inlet side end thereof. Please note that the cross-sectional area of the passage on the plane perpendicular to the center axis J1 is defined as an area of a region surrounded by the outer side surface 2121 of the first hub 212 and the inner side surface 231 of the first housing piece 23. In this preferred embodiment, the outer diameter of the first hub 212 is, for example, about 24 mm at the air-inlet side end thereof and about 25 mm at the air-outlet side end thereof, and the inner diameter of the first housing piece 23 in the region where it radially faces the outer side surface 2121 of the first hub 212 is about 38 mm.

Moreover, in the first axial fan 2, the diameter of the outer side surface 22111 of the first base portion 2211 of the first motor 22 is substantially constant in the axial direction and is smaller than the largest diameter of the outer side surface 2121 of the first hub 212, i.e., the diameter at the air-outlet side end of the first hub 212.

In the first axial fan 2, a driving current is supplied from a power supply provided outside the first axial fan 2 to the armature 2215 via the circuit board 2216 of the first motor 22. The driving current is controlled by the circuit (not shown) of the circuit board 2216, so that a torque is generated between the armature 2215 and the magnet 2222. This torque rotates the first impeller 21 having the first blades 211 which is attached to the rotor 222 about the center axis J1 in a clockwise direction in FIG. 4. Thus, air is taken in from the rotor 222 side of the first motor 22, flows generally along the center axis J1 through the passage defined in the first housing piece 23, and is discharged toward the second axial fan 3.

Figure 5:
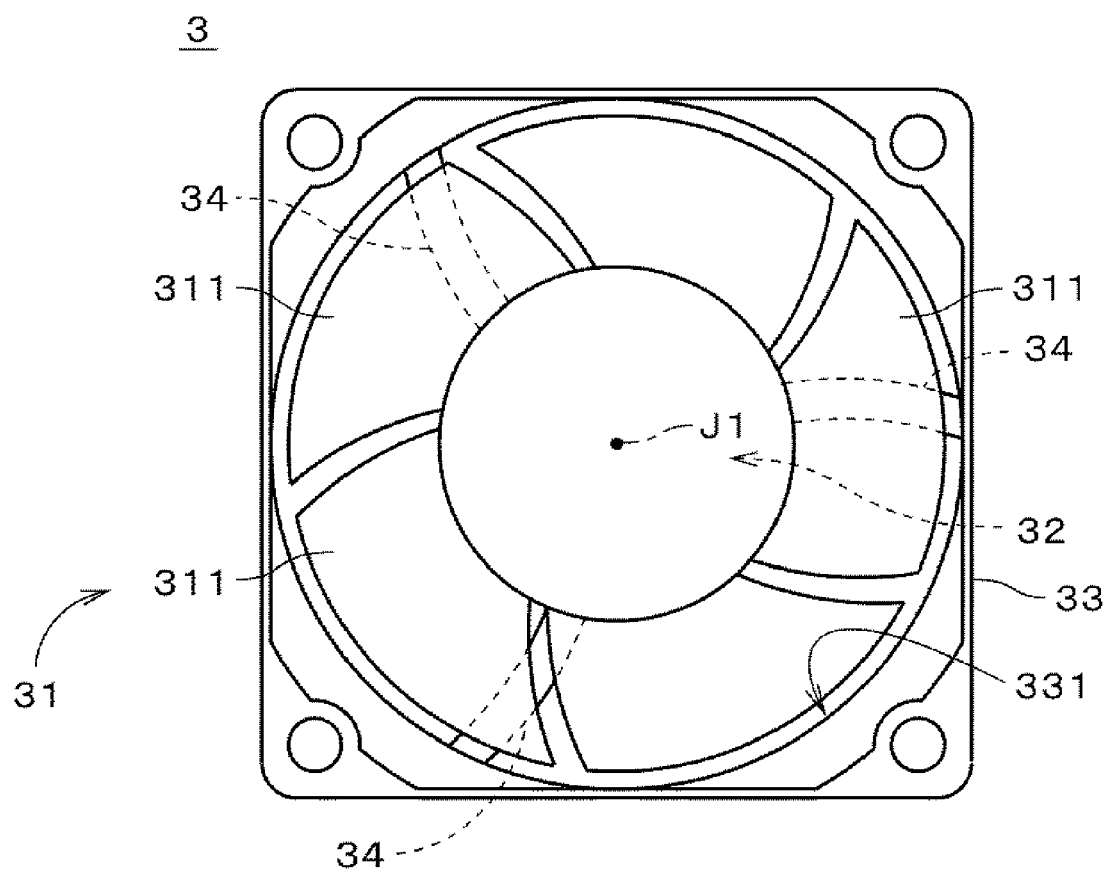
FIG. 5 is a plan view of the second axial fan of the axial fan unit of FIG. 1

FIG. 5 is a plan view of the second axial fan 3 when viewed from the air-inlet side thereof in the axial direction. Referring to FIGS. 3 and 5, the second axial fan 3 includes a second impeller 31 which is disposed coaxially with the first impeller 21 of the first axial fan 2 on the air-outlet side of the first impeller 21. The second impeller 31 has a plurality of second blades 311 radially disposed about the center axis J1 at regular circumferential intervals and extending outward in the radial direction. In this example, five second blades 311 are preferably provided.

The second axial fan 3 includes a second motor 32, a second housing piece 33, and a plurality of second ribs 34. The second motor 32 rotates the second impeller 31 about the center axis J1 in a direction opposite to the rotating direction of the first impeller 21. In this preferred embodiment, the second motor 32 rotates the second impeller 31 in a counterclockwise direction in FIG. 5. The rotation of the second impeller 31 creates an airflow flowing from the air-inlet side to the air-outlet side generally in the axial direction. The second housing piece 33 has an inner surface 331 defining a space. The inner surface 331 of the second housing piece 33 surrounds the second impeller 31 and the second motor 32 from radially outside. The second ribs 34 are provided on an air-outlet side of the second impeller 31 in the axial direction. The second ribs 34 extend from the second motor 32 radially outwardly and are connected to the inner surface 331 of the second housing piece 33. In this manner, the second ribs 34 support the second motor 32. In this illustrated example, preferably three second ribs 34 are provided. That is, the number of the second ribs 34 is preferably equal to that of the first ribs 24.

As shown in FIG. 3, the structure of the second motor 32 is substantially the same as that of the first motor 22. The second motor 32 includes a stationary portion 321 and a rotor portion 322 disposed on an air-inlet side of the stationary portion 321 in the axial direction. The rotor 322 is supported in a rotatable manner about the center axis J1 relative to the stator 321.

The stationary portion 321 includes a second base portion 3211 which has an opening at its center when viewed in the axial direction. In this preferred embodiment, the second base portion 3211 preferably is in the form of a generally circular plate centered on the center axis J1, when viewed in the axial direction. The second base portion 3211 is secured to the inner surface 331 of the second housing piece 33 with the second ribs 34, and supports other components of the stationary portion 321. Center-axis side J1 ends of the second ribs 34 are connected to an outer side surface 32111 of the second base portion 3211, as shown in FIG. 3. In this preferred embodiment, the second base portion 3211, the second ribs 34, and the second housing piece 33 are made of resin, and are formed integrally with one another, for example, by injection molding.

The stationary portion 321 also includes a bearing holder 3212 with ball bearings 3213 and 3214 disposed therein, and an armature 3215 attached to an outer side surface of the bearing holder 3212. The bearing holder 3212 is hollow and can accommodate the ball bearings 3213 and 3214 therein. In this preferred embodiment, the bearing holder 3212 is generally cylindrical. A circuit board 3216 having an opening at its radial center is disposed on an air-outlet side of the armature 3215 in the axial direction. The circuit board 3216 includes a circuit (not shown) which is electrically connected to the armature 3215 and controls the armature 3215. In this preferred embodiment, the circuit board 3216 is in the form of a generally circular plate centered on the center axis J1. The circuit board 3216 is electrically connected to a power supply provided outside the axial fan unit 1 via a bundle of conductive wires.

The rotor 322 includes a yoke 3221 made of magnetic metal, a magnet 3222 for generating a magnetic field, and a shaft 3223 extending from the yoke 3221 toward the air-outlet side of the second axial fan 3. The yoke 3221 is hollow and centered about the center axis J1, and has a lid at its one axial end. In this preferred embodiment, the yoke 3221 is generally cylindrical. The magnet 3222 is secured to an inner side surface of the yoke 3221. The shaft 3223 is inserted into the bearing holder 3212 along the center axis J1, so as to be supported by the ball bearings 3213 and 3214 in a rotatable manner. In the second axial fan 3, the shaft 3223 and the ball bearings 3213 and 3214 together define a bearing assembly which supports the yoke 3221 in a rotatable manner about the center axis J1 relative to the second base portion 3211.

The second impeller 31 includes a second hub 312 and a plurality of second blades 311. The second hub 312 is hollow and centered on the center axis J1, and has a lid at one axial end thereof. In this preferred embodiment, the second hub 312 is generally cylindrical. The second hub 312 covers the outer side surface and the lid of the yoke 3221 of the second motor 32 from the air-inlet side. The second blades 311 are provided on an outer side surface 3121 of the second hub 312 regularly about the center axis J1. That is, the second blades 311 are disposed about the center axis J1 at regular circumferential intervals. The second blades 311 extend radially outward from the second hub 312. In this preferred embodiment, the second hub 312 and the second blades 311 are made of resin. It is preferable to form the second hub 312 and the second blades 311 integrally with each other, for example, by injection molding. In the second axial fan 3, a portion of the stationary portion 321 and a portion of the rotor 322 are disposed radially inside the second hub 312 of the second impeller 31.

Referring to FIG. 3, an outer diameter of the second hub 312 increases from the air-inlet side to the air-outlet side of the second axial fan 3 in the axial direction. In this preferred embodiment, the outer side surface 3121 of the second hub 312 is formed by a portion of a conical surface whose apex is located on the center axis J1 and which is centered on the center axis J1. On the other hand, an inner diameter of the second housing piece 33 is substantially constant in a region where the outer side surface 3121 of the second hub 312 radially faces the inner side surface 3231 of the second housing piece 33.

Thus, in the second axial fan 3, an area of an air passage defined as an area of a region surrounded by the outer surface 3121 of the second hub 312 and the inner surface 331 of the second housing piece 33 is smaller at the air-outlet side of the second hub 312 than at the air-inlet side end thereof when viewed in the axial direction, as in the first axial fan 2. Please note that the area of the air passage mentioned above is a cross-sectional area of the air passage on a plane perpendicular to the center axis J1. In this preferred embodiment, the diameter of the outer side surface 3121 of the second hub 312 is, for example, about 24 mm at the air-inlet side end thereof and about 26 mm at the air-outlet side end thereof, and the diameter of the inner side surface 331 of the second housing piece 33 is about 38 mm in the region where the inner side surface 331 radially faces the outer side surface 3121 of the second hub 312, as in the first housing piece 23.

In the second axial fan 3, the diameter of the outer side surface 32111 of the second base portion 3211 is constant or substantially constant in the axial direction and is smaller than the largest diameter of the outer side surface 3121 of the second hub 312.

When the second motor 32 is driven in the second axial fan 3, the second blades 311 of the second impeller 31 are turned about the center axis J1 in a counterclockwise direction in FIG. 5. Thus, air is taken in from the first axial fan 2 side in FIG. 3, flows through the air passage inside the second housing piece 33, and is then discharged toward the second ribs 34.

In a typical axial fan unit formed by at least two axial fans coaxially connected to each other, a total length of an axial length of the air passage in the first housing piece and that in the second housing piece is relatively large, as compared with the outer diameters of the first impeller and the second impeller. Thus, energy of air, e.g., kinetic energy of air, is decreased by frictional resistance generated by air viscosity, resulting in reduction in the velocity of air.

In the axial fan unit 1 of this preferred embodiment, the diameter of the outer side surface 2121 of the first hub 212 is, for example, about 25 mm at the air-outlet side end thereof and the diameter of the outer side surface 3121 of the second hub 312 is about 26 mm at the air-outlet side end thereof, as described above. Moreover, both the diameter of the inner side surface 231 of the first housing piece 23 in a region where the inner side surface 231 radially faces the outer side surface 2121 of the first hub 212 and the diameter of the inner side surface 331 of the second housing piece 33 in another region where the inner side surface 331 radially faces the outer side surface 3121 of the second hub 312 are about 38 mm, for example. Therefore, the area of the air passage at the air-outlet side end of the second hub 312 is smaller than that at the air-outlet side end of the first hub 212 when viewed in the axial direction. Please note that the area of the air passage when viewed in the axial direction is defined on a plane perpendicular to the center axis J1 by the inner surface 231 or 331 of one of the first and second housing pieces 23 and 33 and the outer side surface 2121 or 3121 of a corresponding one of the first and second hubs 212 and 312. Furthermore, the area of the air passage is smaller at the air-outlet side end of the second hub 312 than at the air-inlet side end thereof when viewed in the axial direction, as described above.

Thus, in the axial fan unit 1 of this preferred embodiment, a flow rate of air at the air-outlet side end thereof can be increased, as compared with a typical axial fan unit in which the area of the air passage is substantially the same at both the air-outlet side and the air-inlet side when viewed in the axial direction or another axial fan unit in which the area of the air passage is larger at the air-outlet side end than at the air-inlet side end when viewed in the axial direction. Consequently, in this preferred embodiment, decreases in the velocity of air flowing in the air passage because of friction caused by air viscosity or the like can be minimized and therefore decreases in a flow rate of air toward the air-outlet side in the passage of the axial fan unit 1 can be reduced.

Moreover, the area of the air passage is smaller at the air-outlet side end of the first hub 212 than at the air-inlet side end thereof when viewed in the axial direction. Please note that this area of the air passage when viewed in the axial direction is defined on a plane perpendicular to the center axis J1 as an area of a region surrounded by the outer side surface 2121 of the first hub 212 and the inner surface 231 of the first housing piece 23. Thus, decreases in the flow rate of air inside the first housing piece 23 toward the air-outlet side can be reduced in the air passage. Consequently, lowering of the flow rate at the air-outlet side end of the axial fan unit 1 can be further suppressed.

Furthermore, in this preferred embodiment, the diameter of the outer side surface 2121 of the first hub 212 at the air-outlet side end thereof is, for example, about 25 mm and the diameter of the outer side surface 3121 of the second hub 312 at the air-inlet side end thereof is about 24 mm, as described above. That is, when the axial fan unit 1 is viewed in its axial direction, the area of the air passage at the air-inlet side end of the second hub 312, defined by the outer side surface 3121 of the second hub 312 and the inner surface 331 of the second housing piece 33, is larger than the area of the air passage at the air-outlet side end of the first hub 212, defined by the outer side surface 2121 of the first hub 212 and the inner surface 231 of the first housing piece 23. With this configuration, interference of air sent from the first axial fan 2 with the second hub 312 can be reduced. Therefore, lowering of the flow rate toward the air-outlet side in the passage of the axial fan unit 1 can be further suppressed.

Figure 6:
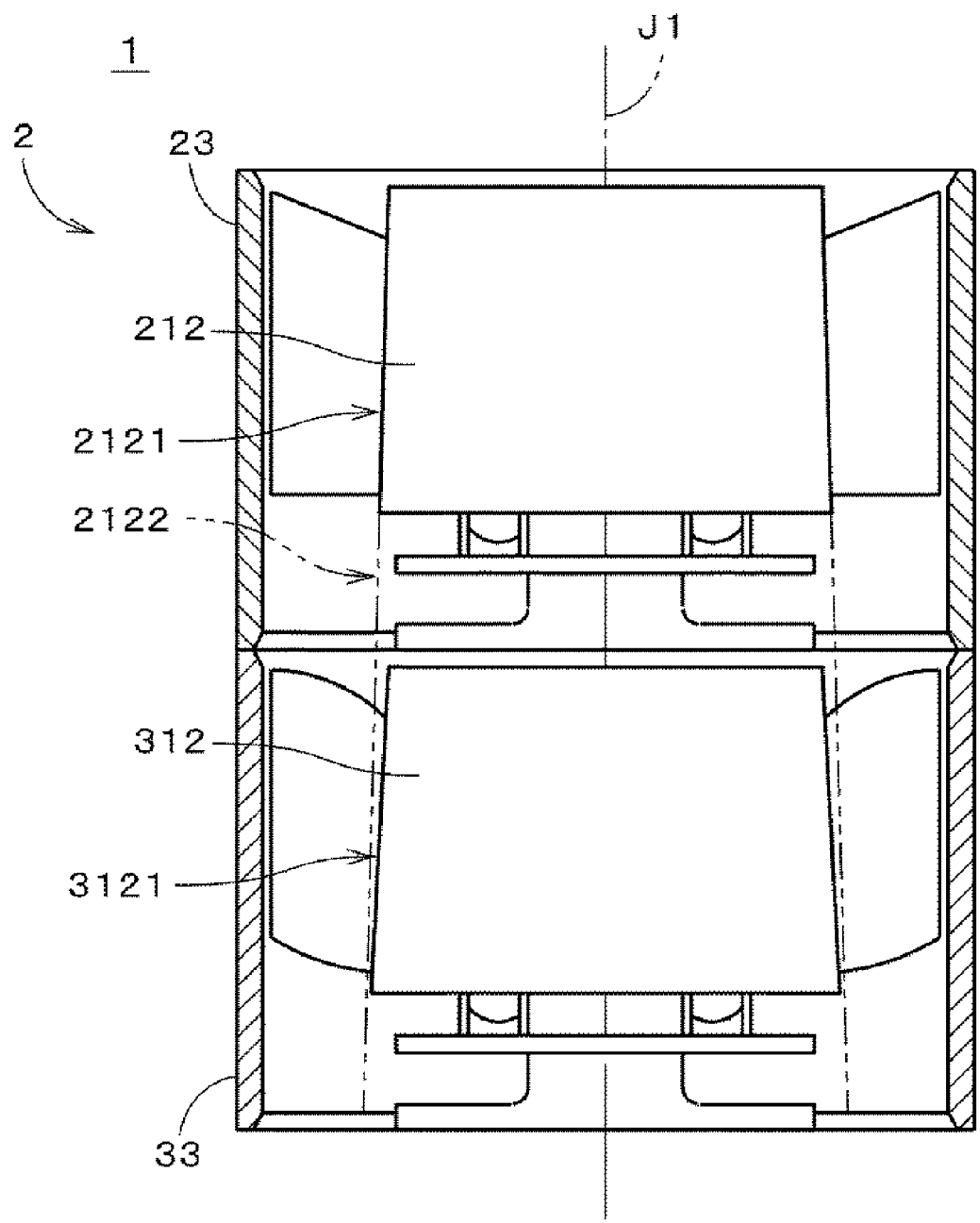
FIG. 6 is a simplified cross-sectional view of the axial fan unit of FIG. 1, taken along a plane including its center axis.

FIG. 6 is a simplified view of the inside of the first and second housing pieces 23 and 33 in the axial fan unit 1 of this preferred embodiment. FIG. 6 shows cross-sections of the first and second housing pieces 23 and 33 but does not shown cross sections of other components (this is the same in FIGS. 8 to 14). As shown in FIG. 6, the outer side surface 3121 of the second hub 312 is located radially inside an extension 2122 (shown with chain double-dashed line in FIG. 6) obtained by extending the outer side surface 2121 of the first hub 212. With this arrangement, interference of air which flows from the first axial fan 2 with the second hub 312 can be further reduced. Thus, lowering of the flow rate at the air-outlet side end of the axial fan unit 1 can be further suppressed.

Returning to FIG. 3, the first motor 22 is secured to the inner surface 231 of the first housing piece 23 with the first ribs 24 axially between the first impeller 21 and the second impeller 31 in the axial fan unit 1 of this preferred embodiment. Moreover, the second motor 32 is secured to the inner side surface 331 of the second housing piece 33 with the second ribs 34 on the air-outlet side of the second impeller 31 in the axial direction. With this arrangement, the structures of the first and second axial fans 2 and 3 can be made approximately the same as each other. Thus, it is easy to manufacture the axial fan unit 1 of this preferred embodiment.

In the axial fan unit 1 of this preferred embodiment, two separate housing pieces, i.e., the first and second housing pieces 23 and 33 are secured to each other while being in axial contact with each other, thereby forming a hollow housing which has an inner side surface radially surrounding the first and second impellers 21 and 31. By securing the first and second housing pieces 23 and 33 formed separately from each other to each other, it is easy to form the housing of the axial fan unit 1, install the first and second impellers 21 and 31 in the housing, and attach the first and second motors 22 and 32 to the housing. Therefore, the axial fan unit 1 can be more easily manufactured.

Second Preferred Embodiment

Figure 7:
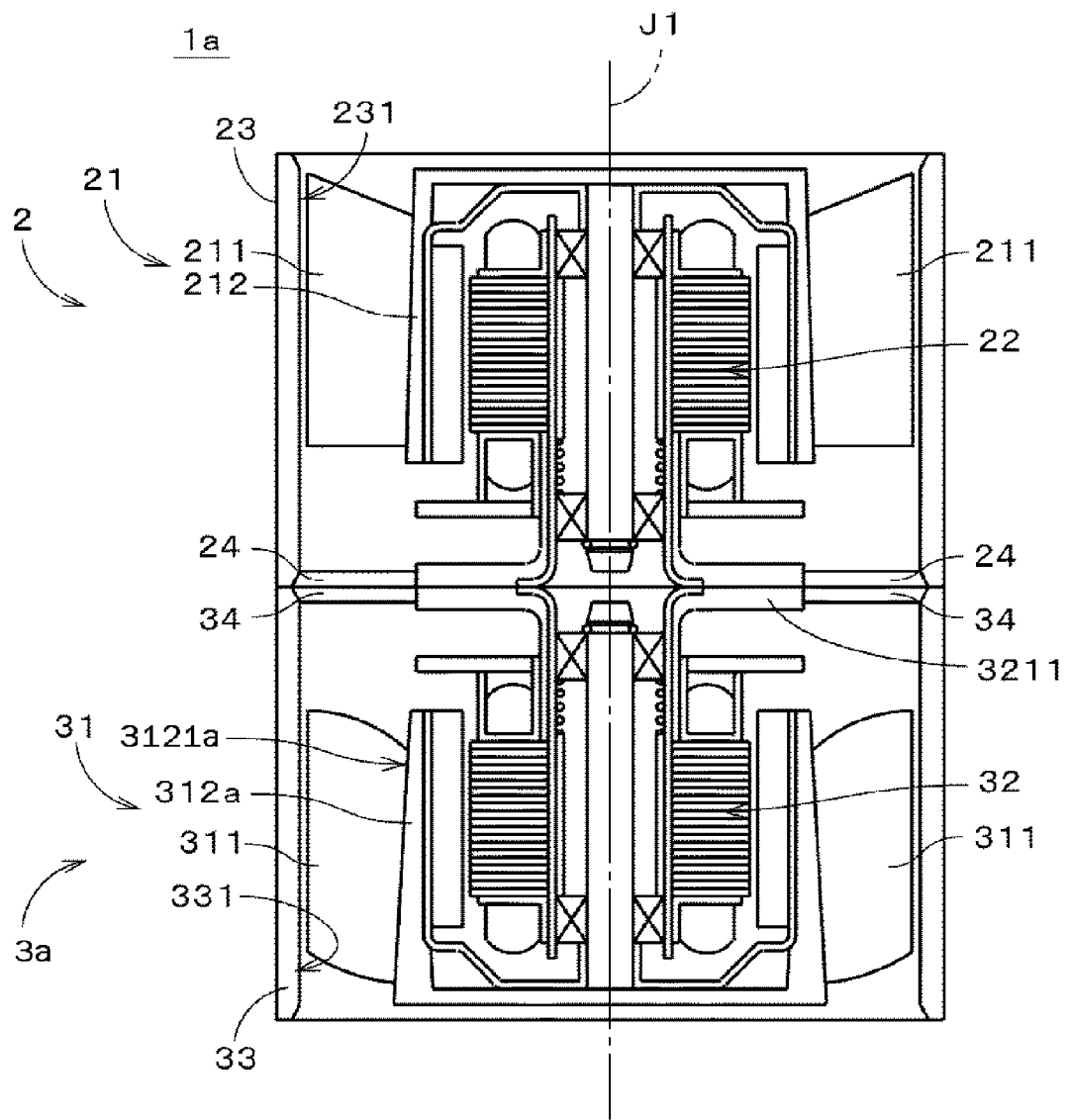
FIG. 7 is a cross-sectional view of an axial fan unit according to a second preferred embodiment of the present invention, taken along a plane including its center axis.

An axial fan unit according to a second preferred embodiment of the present invention is now described. FIG. 7 is a cross-sectional view of the axial fan unit 1a of this preferred embodiment. Referring to FIG. 7, a second axial fan 3a is turned upside down in the axial direction, as compared with the second axial fan 3 in the first preferred embodiment. The second axial fan 3a is connected to the air-outlet side of the first axial fan 2 in the axial direction. The second axial fan 3a includes a second hub 312a having a different shape from the second hub 312 shown in FIG. 3. The diameter of an outer side surface 3121a of the second hub 312a gradually increases from the air-inlet side to the air-outlet side, as in the second hub 312 in the first preferred embodiment shown in FIG. 3. Except for the above features, the structure of the axial fan unit 1a is substantially the same as that of the axial fan unit 1 of the first preferred embodiment shown in FIGS. 1 to 6. Thus, like components are given like reference numerals.

In the axial fan unit 1a of this preferred embodiment, the second base portion 3211 of the second motor 32 of the second axial fan unit 3a is disposed on the air-inlet side of the second impeller 31 in the axial direction. In the illustrated example, the second base portion 3211 is disposed above the second impeller 31. The second ribs 34 are disposed on the air-outlet side of a plurality of first ribs 24. In this preferred embodiment, the number of the first ribs 24 is preferably the same as that of the second ribs 34 and is three, for example. Moreover, in this preferred embodiment, each second supporting rib 34 is axially covered by a corresponding one of the first ribs 24 over its entire length when viewed in the axial direction. In other words, the first and second motors 22 and 32 are secured to the inner surface 231 of the first housing piece 23 and the inner surface 331 of the second housing piece 33 with a plurality of supporting ribs which are disposed axially between the first and second impellers 21 and 31 to extend radially outward, i.e., the first and second ribs 24 and 34.

In the axial fan unit 1a of this preferred embodiment, the area of the air passage at the air-outlet side end of the second hub 312a is smaller than that at the air-outlet side end of the first hub 212 and that at the air-inlet side end of the second hub 312 when the axial fan unit 1a is viewed in the axial direction, as in the axial fan unit 1 of the first preferred embodiment. Please note that the area of the air passage when viewed in the axial direction is defined on a plane perpendicular to the center axis J1 as an area of a region surrounded by the outer side surface 2121 or 3121 of the first or second 212 or 312 and the inner surface of a corresponding one of the first and second housing pieces. With this arrangement, lowering of a flow rate of air flowing generally in the axial direction, which increases toward the air-outlet side, can be suppressed in the air passage of the axial fan unit 1a. In addition, the area of the air passage at the air-outlet side end of the second hub 312, defined as the area of the region surrounded by the outer side surface 3121 of the second hub 312a and the inner surface of the second housing piece 33, is smaller than the area of the air passage at the air-inlet end of the first hub 212, defined as the area of the region surrounded by the outer side surface 2121 of the first hub 212 and the inner surface 231 of the first housing piece 23 when viewed in the axial direction. Therefore, lowering of the flow rate toward the air-outlet side in the air passage can be further suppressed.

Moreover, the area of the air passage at the air-inlet side end of the second hub 312a, which is defined by the outer side surface 3121 of the second hub 312a and the inner surface 331 of the second housing piece 33, is larger than the area of the air passage at the air-outlet side end of the first hub 212, which is defined by the outer side surface 2121 of the first hub 212 and the inner surface 231 of the first housing piece 23, when the axial fan unit 1a is viewed in the axial direction, as in the first preferred embodiment. Thus, interference of air which flows from the first axial fan 2 generally in the axial direction with the second hub 312a can be reduced. Consequently, lowering of the flow rate toward the air-outlet side in the air passage can be further suppressed.

In the axial fan unit 1a of this preferred embodiment, the first ribs 24 and the second ribs 34 which support the first motor 22 and the second motor 32, respectively, are disposed axially between the first and second impellers 21 and 31. Thus, an axial distance between the first and second impellers 21 and 31 can be made larger than that in the first preferred embodiment. Therefore, interference of air axially transmitted by the first blades 211 toward the air-outlet side of the axial fan unit 1a with the second blades 311 can be suppressed, resulting in reduction of an operation sound of the axial fan unit 1a.

Third Preferred Embodiment

Figure 8:
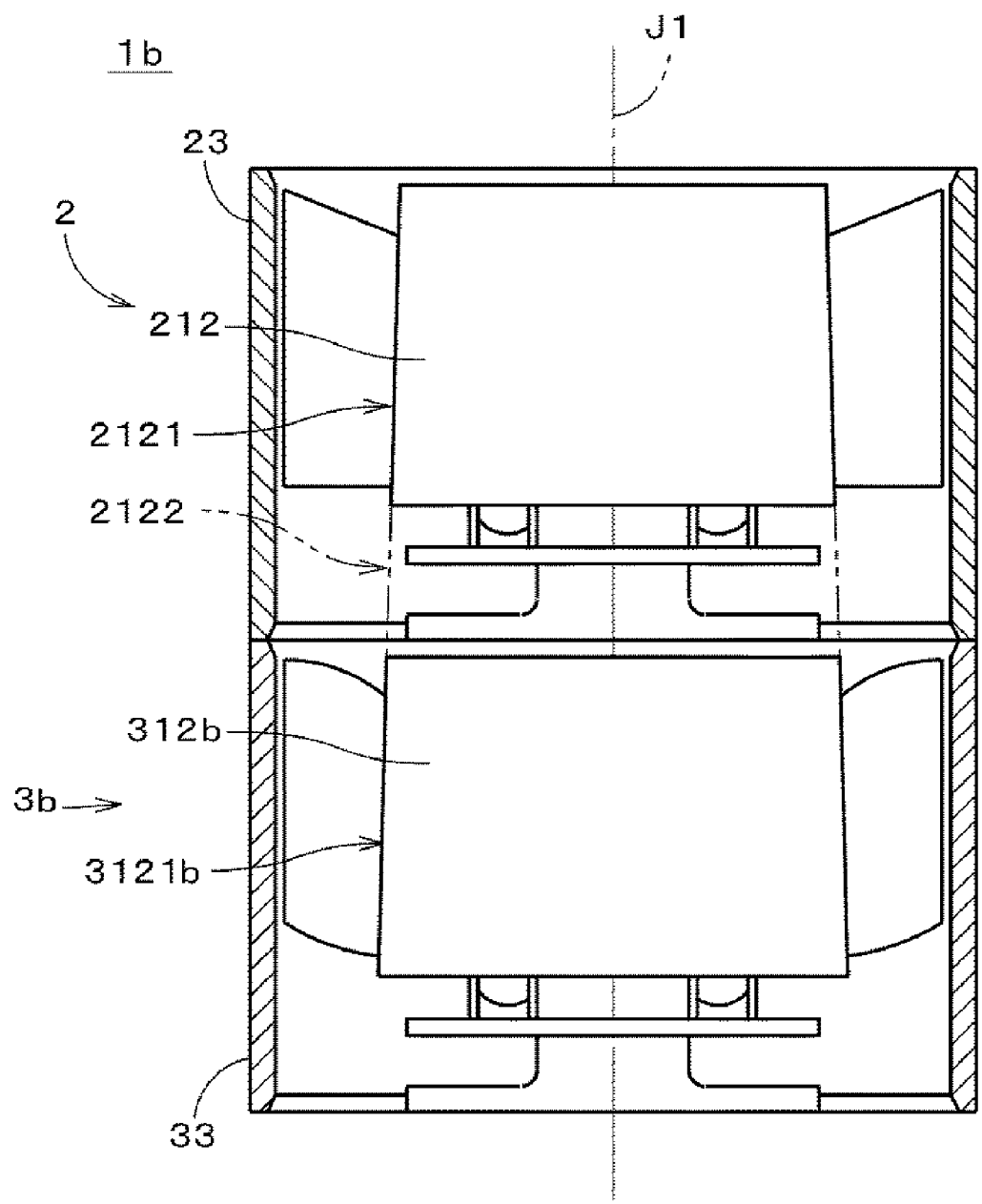
FIG. 8 is a simplified cross-sectional view of an axial fan unit according to a third preferred embodiment of the present invention, taken along a plane including its center axis.

An axial fan unit according to a third preferred embodiment of the present invention is now described. FIG. 8 shows the inside of the first and second housing pieces 23 and 33 of the axial fan unit 1b of this preferred embodiment. Referring to FIG. 8, a second hub 312b of the axial fan unit 1b is different in shape from the second hub 312 of the axial fan unit 1 shown in FIG. 6. An outer side surface 3121b of the second hub 312b forms a portion of an extension 2122 (shown with chain double-dashed line in FIG. 8) obtained by extending the outer side surface 2121 of the first hub 212 toward the air-outlet side of the axial fan unit 1b. Except for the above features, the structure of the axial fan unit 1b is substantially the same as that of the axial fan unit 1 shown in FIGS. 1 to 6. Therefore, like components are given like reference numerals in FIG. 8 and in the following description.

Also in the axial fan unit 1b of this preferred embodiment, lowering of a flow rate of air toward the air-outlet side in the air passage can be suppressed, as in the first preferred embodiment. In addition, interference of air sent from the first axial fan 2 with the second hub 312b can be further reduced, especially because the outer side surface 3121b of the second hub 312b is a portion of the extension 2122 of the outer side surface 2121 of the first hub 212. Consequently, lowering of the flow rate of air toward the air-outlet side can be more effectively suppressed in the air passage.

Fourth Preferred Embodiment

Figure 9:
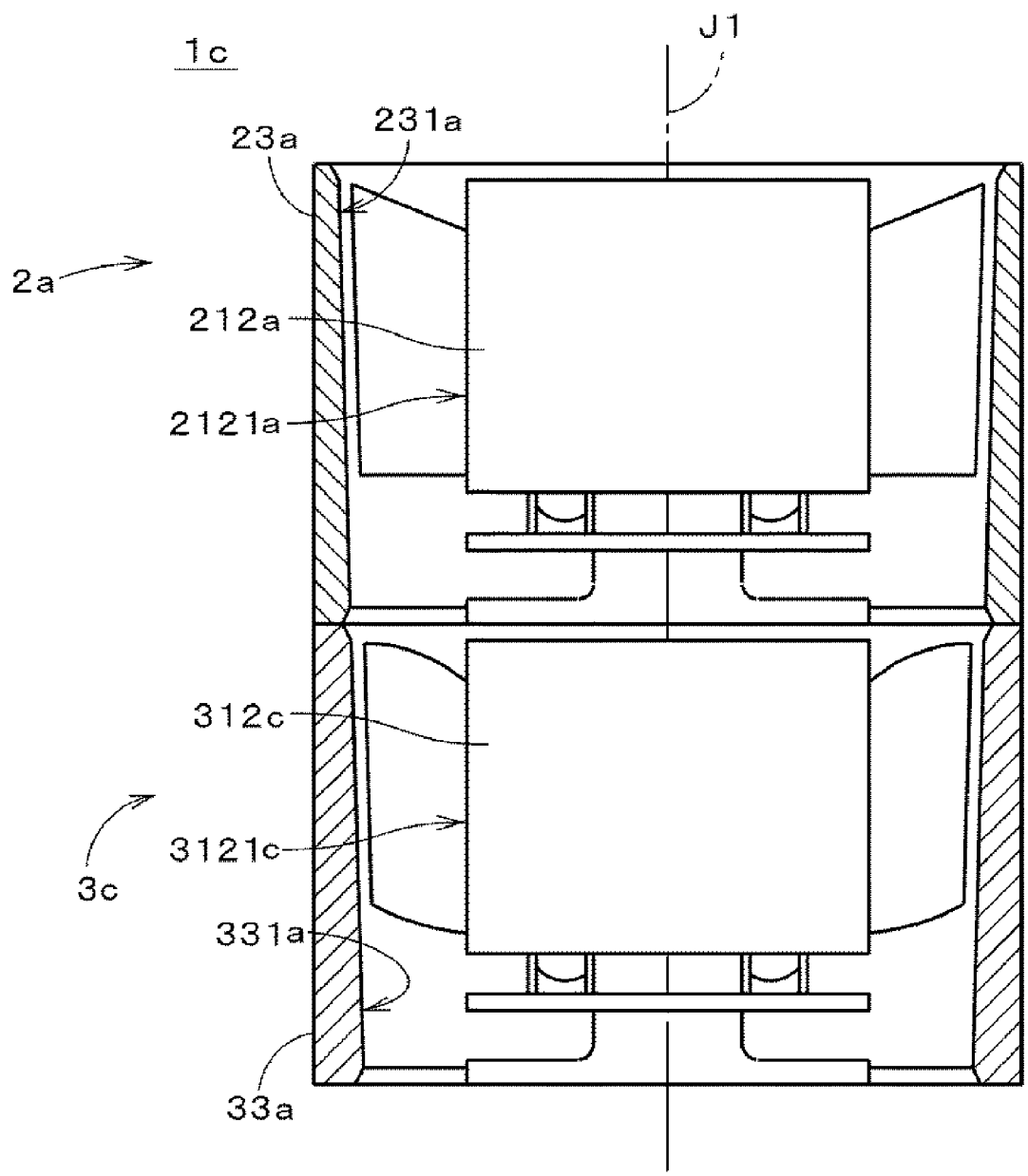
FIG. 9 is a simplified cross-sectional view of an axial fan unit according to a fourth preferred embodiment of the present invention, taken along a plane including its center axis.

An axial fan unit according to a fourth preferred embodiment of the present invention is now described. FIG. 9 shows the inside of first and second housing pieces 23a and 33a of the axial fan unit 1c of this preferred embodiment. As shown in FIG. 9, the axial fan unit 1c includes a first hub 212a and a second hub 312c which are different in shape from the first hub 212 and the second hub 312 of the first preferred embodiment shown in FIG. 6, respectively. Moreover, the axial fan unit 1c includes a first housing piece 23a and a second housing piece 33a which are different in shape from the first housing piece 23 and the second housing piece 33 of the first preferred embodiment, respectively. Except for the above features, the axial fan unit 1c is substantially the same as the axial fan unit 1 of the first preferred embodiment shown in FIGS. 1 to 6. Therefore, like components are given like reference numerals in FIG. 9 and the following description.

Referring to FIG. 9, in the axial fan unit 1c, the diameter of an outer side surface 2121a of the first hub 212a is substantially equal to the diameter of an outer side surface 3121c of the second hub 312c. Both those diameters are constant in the axial direction. On the other hand, the diameter of an inner surface 231a of the first housing piece 23a gradually decreases from the air-inlet side to the air-outlet side in the axial direction. Similarly, the diameter of an inner surface 331a of the second housing piece 33a decreases from the air-inlet side to the air-outlet side in the axial direction. Moreover, the inner surface 331a of the second housing piece 33a is a portion of an extension obtained by extending the inner surface 231a of the first housing piece 23a toward the air-outlet side of the axial fan unit 1c.

With this configuration, when the axial fan unit 1c is viewed in the axial direction, the area of the air passage at the air-outlet side end of the second hub 312c is smaller than that at the air-outlet side end of the first hub 212a, and is also smaller than that at the air-inlet side end of the second hub 312c. Please note that the area of the air passage is defined on a plane perpendicular to the center axis J1 as an area of a region surrounded by the outer side surface 2121a or 3121c of one of the first and second hubs 212a and 312c and the inner surface of a corresponding one of the first and second housing pieces 23a and 33a. Consequently, lowering of a flow rate of air toward the air-outlet side, which is caused by energy loss of the air, can be suppressed in the air passage. Moreover, the area of the air passage at the air-outlet side end of the first hub 212c is smaller than that at the air-inlet side end of the first hub 212a, when the axial fan unit 1c is viewed in the axial direction. Therefore, the above effect of suppressing the lowering of the flow rate can be further enhanced.

In the axial fan unit 1c, the inner diameter of each of the first and second housing pieces 23a and 33a is made smaller toward the air-outlet side in the axial direction. Thus, air sent from the second axial fan 3 to the outside of the axial fan unit 1c can be efficiently converged toward the center axis J1. Alternatively, both the inner diameter of each of the first and second housing pieces 23a and 33a and the outer diameters of the first and second hubs may be changed.

Fifth Preferred Embodiment

Figure 10:
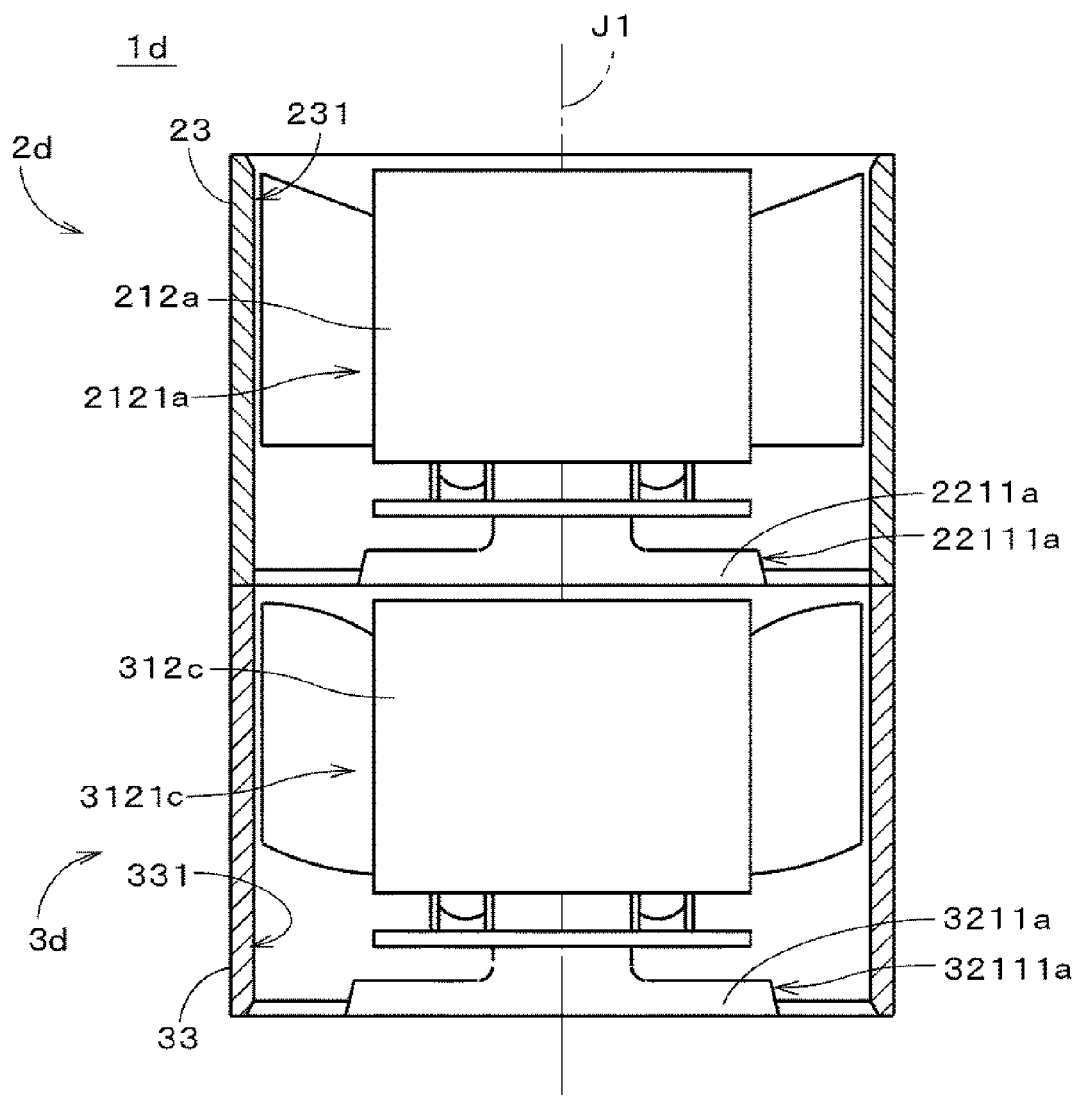
FIG. 10 is a simplified cross-sectional view of an axial fan unit according to a fifth preferred embodiment of the present invention, taken along a plane including its center axis.

An axial fan unit of a fifth preferred embodiment of the present invention is now described. FIG. 10 shows the inside of the first and second housing pieces 23 and 33 of the axial fan unit 1d of the fifth preferred embodiment. Referring to FIG. 10, the axial fan unit 1d includes the first hub 212a and the second hub 312c of the fourth preferred embodiment shown in FIG. 9, and a first base portion 2211a and a second base portion 3211a which are different in shape from the first base portion 2211 and the second base portion 3211 of the first preferred embodiment shown in FIG. 6. Except for the above features, the axial fan unit 1d of this preferred embodiment is substantially the same as the axial fan unit 1 of the first preferred embodiment shown in FIGS. 1 to 6. Therefore, like components are given like reference numerals in FIG. 10 and in the following description.

Referring to FIG. 10, the diameter of the outer side surface 2121c of the first hub 212a is substantially equal to the diameter of the outer side surface 3121a of the second hub 312c in the axial fan unit 1d. Both those diameters are substantially constant in the axial direction. In the first axial fan 2d, the diameter of an outer side surface 22111a of the first base portion 2211a becomes larger from the air-inlet side to the air-outlet side. The smallest diameter of the outer side surface 22111a, i.e., the diameter of the outer side surface 22111a at the air-inlet side end of the first base portion 2211a is larger than the diameter of the outer side surface 2121a of the first hub 212a.

With this arrangement, when the axial fan unit 1d is viewed in the axial direction, the area of the air passage which is defined as an area of a region surrounded by the outer side surface 22111a of the first base portion 2211a and the inner surface 231 of the first housing piece 23 is smaller than the area of the air passage which is defined as an area of a region surrounded by the outer side surface 2121a of the first hub 212a and the inner surface 231 of the first housing piece 23.

In the second axial fan 3d, the diameter of an outer side surface 32111a of the second base portion 3211a gradually increases from the air-inlet side to the air-outlet side, and the smallest diameter of the outer side surface 32111a (i.e., the diameter of the outer side surface 32111a at the air-inlet side end of the second base portion 3211a) is larger than the diameter of the outer side surface 3121c of the second hub 312c, as in the first axial fan 2d. Moreover, the average diameter of the outer side surface 32111a of the second base portion 3211a is larger than the average diameter of the outer side surface 22111a of the first base portion 2211a in this preferred embodiment.

With this arrangement, when the axial fan unit 1d is viewed in the axial direction, the area of the air passage which is defined as an area of a region surrounded by the outer side surface 32111a of the second base portion 3211a and the inner surface 331 of the second housing piece 33 is smaller than the area of the air passage which is defined as an area of a region surrounded by the outer side surface 3121c of the second hub 312c and the inner surface 331 of the second housing piece 33, and is also smaller than the area of the air passage which is defined as an area of a region surrounded by the outer side surface 22111a of the first base portion 2211a and the inner surface 231 of the first housing piece 23. Consequently, decreases in a flow rate of air toward the air-outlet side in the passage, which is caused by energy loss of the air flowing generally along the center axis J1, can be reduced in the axial fan unit 1d, as in the first preferred embodiment. In addition, the diameter of the outer side surface 22111a of the first base portion 2211a and that of the outer side surface 32111a of the second base portion 3211a gradually increase from the air-inlet side ends to the air-outlet side ends. Therefore, decreases in the flow rate of air on or near the outer side surface of each base portion can be reduced.

The axial fan unit 1d may include the first and second hubs each having an outer diameter which is axially changed, instead of the first and second hubs 212a and 312c. In this case, the smallest diameter of the outer side surface 22111a of the first base portion 2211a is set to be larger than the largest diameter of the outer side surface of the first hub, and the smallest diameter of the outer side surface 32111a of the second base portion 3211a is set to be larger than the largest diameter of the outer side surface of the second hub.

The first to fifth preferred embodiments of the present invention have been described above. However, the present invention is not limited to the above preferred embodiments but can be modified in various ways.

For example, the axial fan unit 1 of the first preferred embodiment may be modified such that the first ribs 24 of the first axial fan 2 are provided on the air-inlet side of the first impeller 21 (i.e., the opposite side of the first impeller 21 to the second impeller 31) and the second ribs 34 of the second axial fan 3 are provided on the air-inlet side of the second impeller 31 (i.e., between the first impeller 21 and the second impeller 31).

Figure 11:
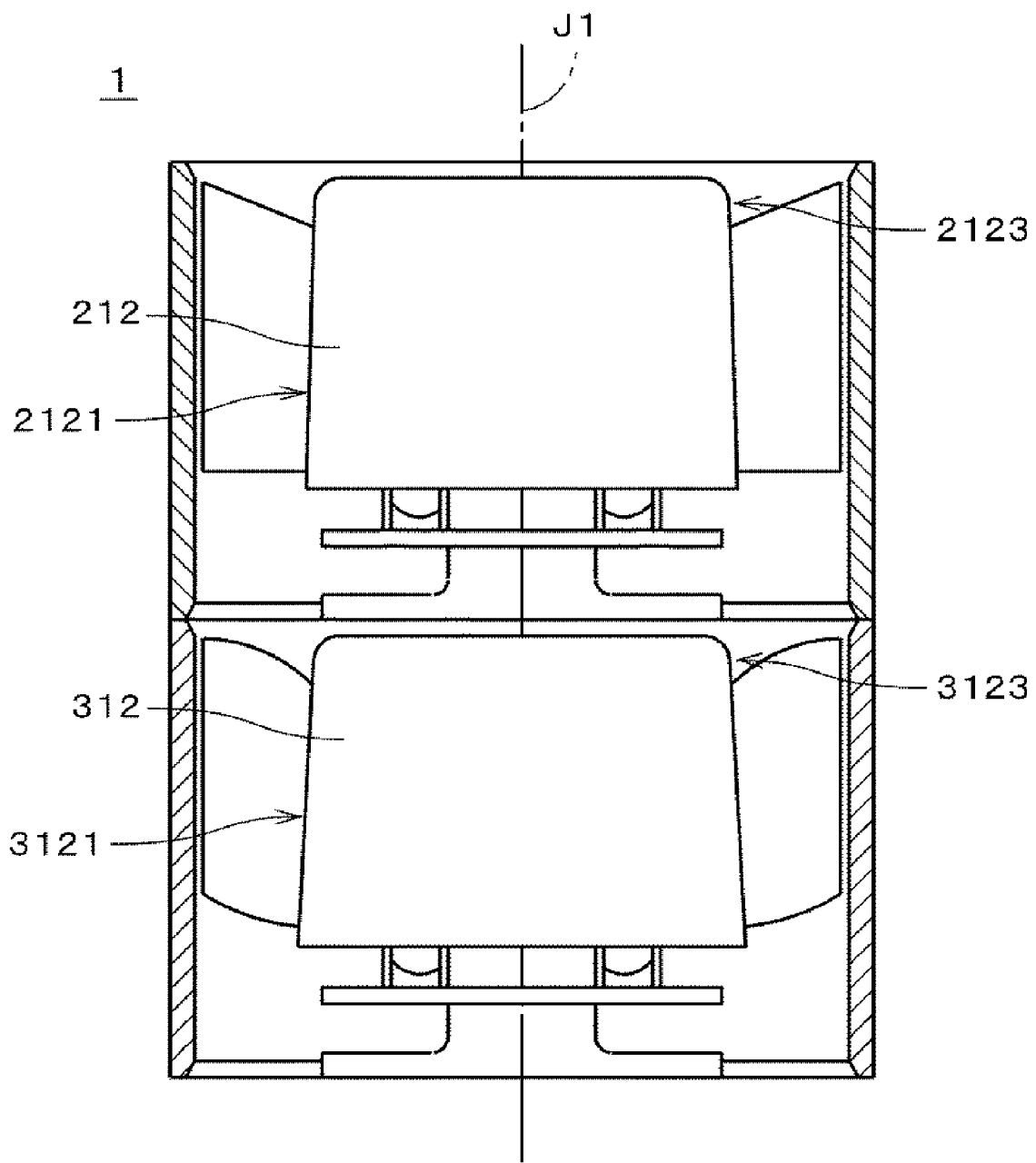
FIGS. 11, 12, 13, and 14 are simplified cross-sectional views of axial fan units according to other preferred embodiments of the present invention, taken along a plane including a center axis.

Moreover, in the axial fan unit 1 of the first preferred embodiment, air-inlet side ends of each of the first and second hubs 212 and 312 may be chamfered, as shown in FIG. 11. The chamfered portion 2123 of the first hub 212 is a portion between the outer side surface 2121 of the first hub 212 and a surface thereof perpendicular to or substantially perpendicular to the center axis J1. Similarly, the chamfered portion 3123 of the second hub 312 is a portion between the outer side surface 3121 of the second hub 312 and a surface thereof perpendicular to or substantially perpendicular to the center axis J1.

In any of the axial fan units 1, 1a, and 1b of the first, second, and third preferred embodiments, the diameter of the inner surface 231 of the first housing piece 23 is not necessarily constant in the axial direction in a region where the inner surface 231 radially faces the first hub 212. It is only necessary that the diameter of the inner surface 231 be substantially constant at an axial position at which the air-outlet side end of the first hub 212 in the axial direction radially faces the inner surface of the first housing piece and around that position. Similarly, it is only necessary that the diameter of the inner surface 331 of the second housing piece 331 be substantially constant at a position at which the air-outlet side end of the second hub in the axial direction radially faces the inner surface of the second housing piece and around that position.

In the axial fan unit 1d of the fifth preferred embodiment, it is only necessary that the average diameter of the outer side surface 22111a of the first base portion 2211a is larger than the largest diameter of the outer side surface 2121a of the first hub 212a, and the average diameter of the outer side surface 32111a of the second base portion 3211a is larger than both the largest diameter of the outer side surface 3121c of the second hub 312c and the average diameter of the outer side surface 22111a of the first base portion 2211a. With this arrangement, the area of the air passage on a plane perpendicular to the center axis J1, defined by the outer side surface 32111a of the second base portion 3211a and the inner surface of the second housing piece is smaller than the area of the air passage on a plane perpendicular to the center axis J1, defined by the first base portion 2211a and the inner surface of the first housing piece. Thus, lowering of a flow rate of air flowing generally in the axial direction, which increases toward the air-outlet side, can be suppressed in the air passage inside the housing of the axial fan unit 1d.

In any of the axial fan units of the first to fifth preferred embodiments, an integrally formed hollow housing may be used and arranged to radially surround the first and second impellers 21 and 31, instead of using the first and second housing pieces 23 and 33.

Figure 12:
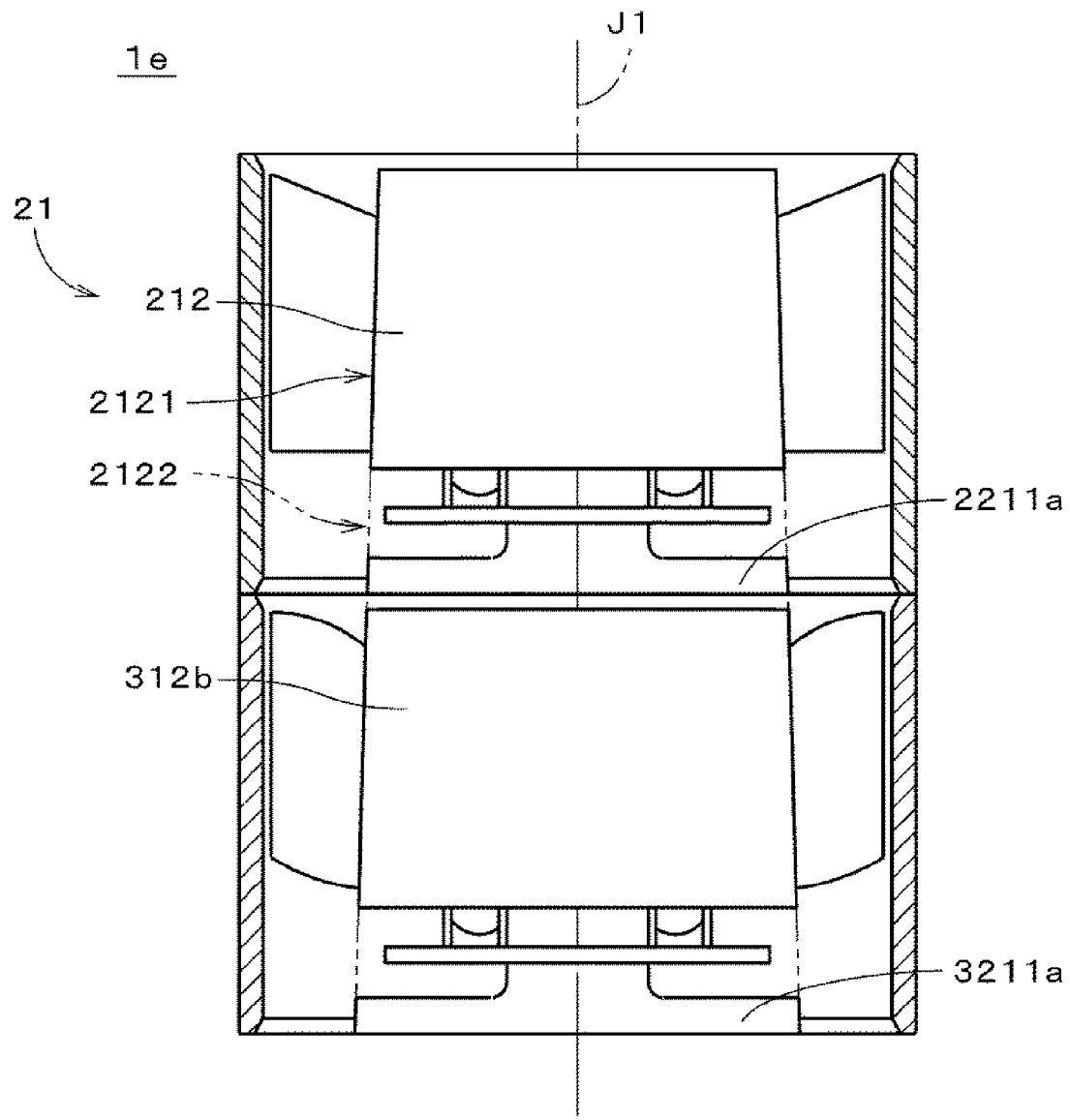
Figure 13:
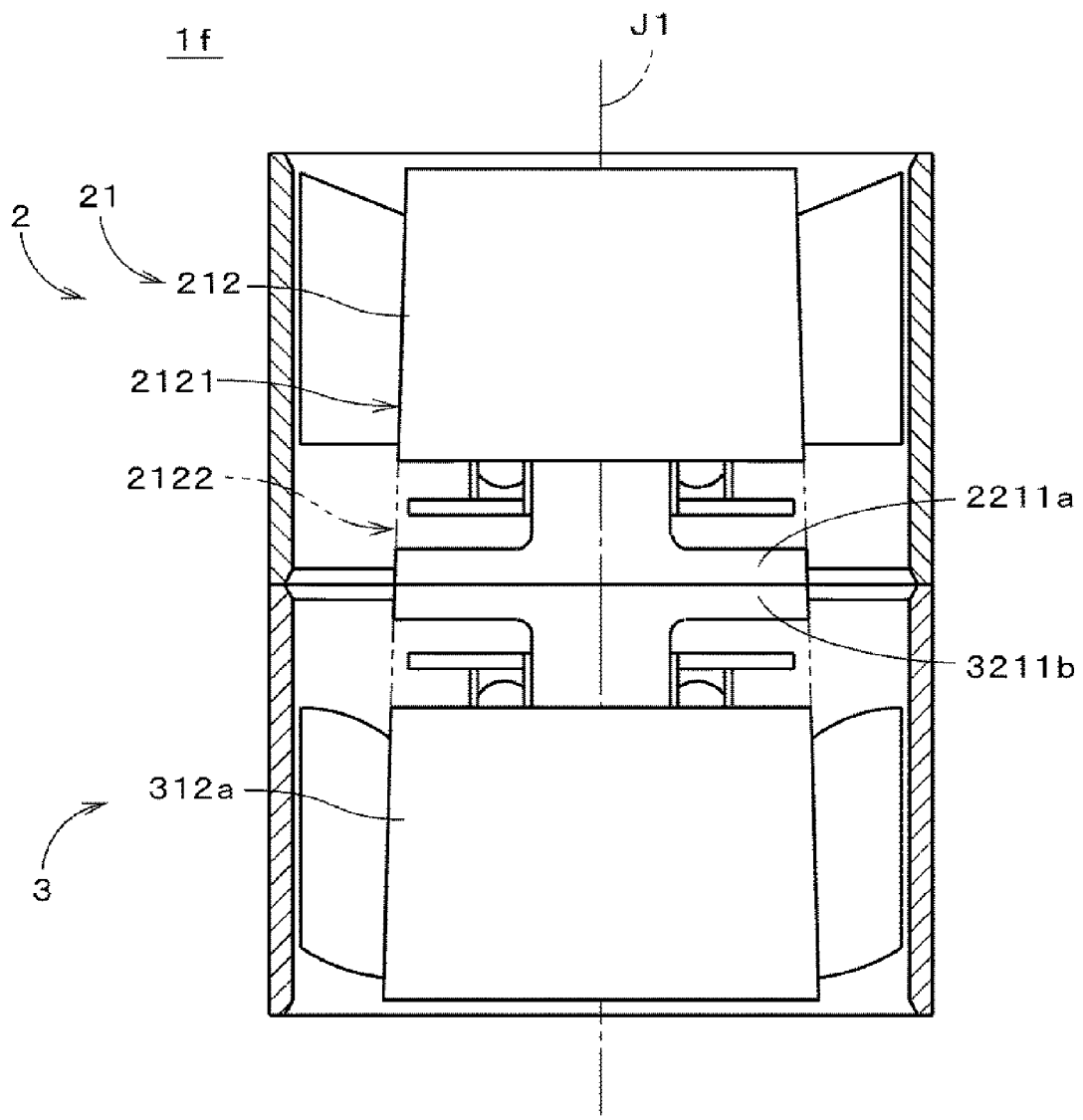
Figure 14:
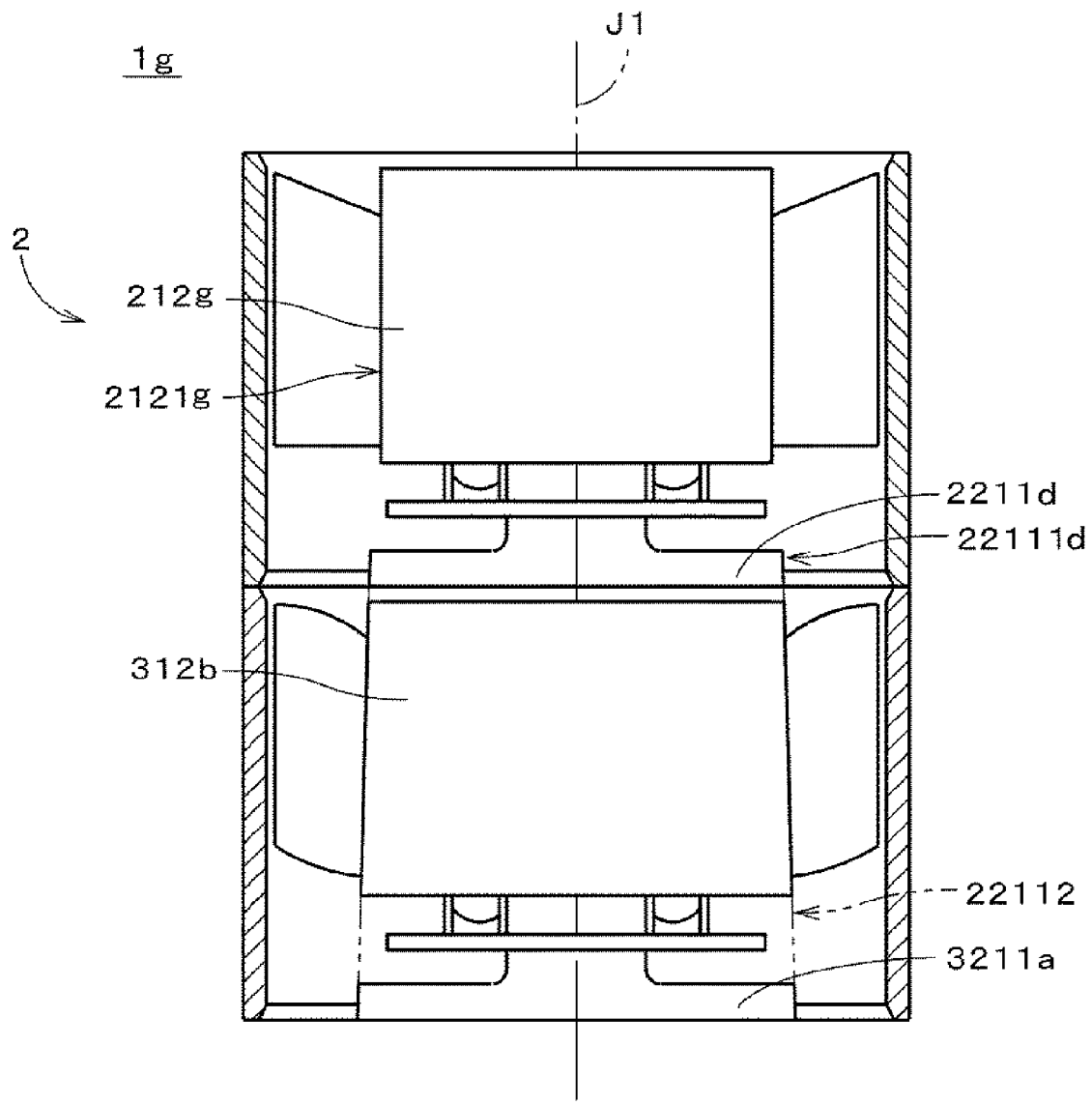

FIGS. 12, 13 and 14 show axial fan units according to other preferred embodiments of the present invention. The axial fan unit 1e of FIG. 12 includes a combination of the first and second hubs 212 and 312b shown in FIG. 8 and a combination of the first and second base portions 2211a and 3211a shown in FIG. 10. As shown in FIG. 12, in the axial fan unit 1e, the diameter of the outer side surface of each of the first hub 212, the first base portion 2211a, the second hub 312b, and the second base portion 3211a gradually increases from the air-inlet side to the air-outlet side in the axial direction. In addition, the outer side surfaces of the first base portion 2211a, the second hub 312b, and the second base portion 3211d are coincident or substantially coincident with a portion of an extension 2122 obtained by axially extending the outer side surface 2121 of the first hub 212 to the air-outlet side.

In the axial fan unit 1*f* of FIG. 13, the second axial fan 3 is turned upside down as in the second preferred embodiment, and is secured on the air-outlet side of the first axial fan 2 in the axial direction. The axial fan unit 1*f* of FIG. 13 includes a second base portion 3211*b*, a combination of the first and second hubs 212 and 312*a* shown in FIG. 7, and the first base portion 2211*a* of FIG. 12. As shown in FIG. 13, in the axial fan unit 1*f*, the diameter of the outer side surface of each of the first hub 212, the first base portion 2211*a*, the second base portion 3211*b*, and the second hub 312*a* gradually increases from the air-inlet side to the air-outlet side. In addition, the outer side surfaces of the first base portion 2211*a*, the second base portion 3211*b*, and the second hub 312*a* are coincident or substantially coincident with a portion of an extension 2122 of the outer side surface 2121 of the first hub 212.

In each of the axial fan units 1*e* and 1*f* shown in FIGS. 12 and 13, when the axial fan unit is viewed in the axial direction, the cross-sectional area of the air passage defined as an area of a region surrounded by the outer side surface of the second hub and the inner surface of the second housing piece at the air-outlet side end of the second hub is smaller than the cross-sectional area of the air passage defined as an area of a region surrounded by the outer side surface of the first hub and the inner side surface of the first housing piece at the air-outlet side end of the first hub and the cross-sectional area of the air passage defined as an area of a region surrounded by the outer side surface of the second hub and the inner side surface of the second housing piece at the air-inlet side end of the second hub. Thus, decreases in the flow rate of air in the passage toward the air-outlet side can be reduced. Moreover, interference of air made to flow in the axial direction by rotation of the first impeller 21 with the first base portion 2211*a*, the second hub, and the second base portion is reduced, so that lowering of the flow rate toward the air-outlet side in the passage can be further suppressed.

The axial fan unit 1*g* of FIG. 14 includes a first hub 212*b*, and a combination of the first base portion 2211*a*, the second hub 312*b*, and the second base portion 3211*a* shown in FIG. 12.

As shown in FIG. 14, in the axial fan unit 1*g*, the outer diameter of each of the first base portion 2211*a*, the second hub 312*b*, and the second base portion 3211*a* gradually increases from the air-inlet side to the air-outlet side. The outer side surfaces of the second hub 312*b* and the second base portion 3211*a* form a portion of an extension 22112 of the outer side surface 22111 of the first base portion 2211*a* to the air-outlet side. Moreover, the diameter of the outer side surface 2121 of the first hub 212*b* is constant or substantially constant in the axial direction and is smaller than the smallest diameter of the first base portion 2211*a*.

When the axial fan unit 1*g* is viewed in the axial direction, the cross-sectional area of the air passage, defined as an area of a region surrounded by the outer side surface of the second hub 312*b* and the inner surface of the second housing, at the air-outlet side end of the second hub 312*b* is smaller than the cross-sectional area of the air passage defined as an area of a region surrounded by the outer side surface of the first hub 212*b* and the inner surface of the first housing piece at the air-outlet side end of the first hub; the cross-sectional area of the air passage defined as an area of a region surrounded by the outer side surface of the first base portion 2211*a* and the inner surface of the first housing piece; and the cross-sectional area of the air passage defined as an area of a region surrounded by the outer side surface of the second hub 312*b* and the inner surface of the second housing piece at the air-inlet side end of the second hub 312*b*. In addition, when the axial fan unit 1*g* is viewed in the axial direction, the cross-sectional area of the air passage defined as an area of a region surrounded by the outer side surface of the second base portion 3211*a* and the inner surface of the second housing piece is smaller than the cross-sectional area of the air passage defined as an area of a region surrounded by the outer side surface of the first base portion 2211*a* and the inner surface of the first housing piece. Thus, lowering of the flow rate toward the air-outlet side in the passage can be suppressed inside the housing of the axial fan unit 1*g*. Furthermore, interference of air sent from the first axial fan 2 with the second hub 312*b* and the second base portion 3211*a* can be reduced. Consequently, lowering of the flow rate toward the air-outlet side in the passage can be further suppressed.

In any of the aforementioned axial fan units, the first impeller and the second impeller may rotate about the center axis J1 in the same direction. Moreover, the same effects as those described above can be also obtained in axial fan units in which three or more axial fans are provided.

According to various preferred embodiments of the present invention, it is possible to reduce decreases in a flow rate of air which increases toward an air-outlet side in an axial fan unit.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An axial fan unit comprising:
    a first impeller including a first hub centered on a center axis and a plurality of first blades disposed about the center axis outside the first hub in a radial direction perpendicular or substantially perpendicular to the center axis;
    a first motor disposed in the first hub and operable to rotate the first impeller about the center axis to create a first airflow flowing generally axially;
    a second impeller disposed downstream of the first impeller in a direction of the first airflow coaxially or substantially coaxially with the first impeller, the second impeller including a second hub and a plurality of second blades disposed about the center axis outside the second hub in the radial direction;
    a second motor disposed in the second hub and operable to rotate the second impeller about the center axis to create a second airflow flowing in the same direction as the first airflow; and
    a housing arranged to radially surround the first and second impellers; wherein
    a radial thickness of the first hub and a radial thickness of the second hub both gradually increase in an axial direction such that radial outermost portions of the first hub and the second hub are aligned to define a straight line with a constant or substantially constant slope extending in the radial and the axial directions; and
    when the axial fan unit is viewed along the center axis, a cross-sectional area of a region surrounded by an outer side surface of the second hub and an inner surface of the housing at a downstream end of the second hub in the direction of the first and second airflows is smaller than a cross-sectional area of a region surrounded by an outer side surface of the first hub and the inner surface of the housing at a downstream end of the first hub and a cross-sectional area of a region surrounded by the outer side surface of the second hub and the inner surface of the housing at an upstream end of the second hub.

2. An axial fan unit according to claim 1, wherein the cross-sectional area of the region surrounded by the outer side surface of the first hub and the inner surface of the housing is smaller at the downstream end of first hub than at an upstream end of the first hub, when the axial fan unit is viewed along the center axis.

3. An axial fan unit according to claim 2, wherein an inner diameter of the housing is substantially constant at a first portion at which the housing radially faces the downstream end of the first hub and a second portion at which the housing radially faces the downstream end of the second hub and around the first and second portions.

4. An axial fan unit according to claim 3, wherein the outer side surface of the second hub is located on an extension of the outer side surface of the first hub.

5. An axial fan unit according to claim 1, wherein the cross-sectional area of the region surrounded by the outer side surface of the second hub and the inner surface of the housing at the upstream end of the second hub is larger than a cross-sectional area of a region surrounded by the outer side surface of the first hub and the inner surface of the housing at a downstream end of the first hub, when the axial fan unit is viewed along the center axis.

6. An axial fan unit according to claim 1, further comprising a plurality of first ribs arranged to secure the first motor to the housing and a plurality of second ribs arranged to secure the second motor to the housing, wherein at least one of the first and second ribs are disposed axially between the first and second impellers.

7. An axial fan unit according to claim 6, wherein both the first and second ribs are disposed axially between the first and second impellers.

8. An axial fan unit comprising:
a first impeller including a first hub centered on a center axis and a plurality of first blades disposed about the center axis outside the first hub in a radial direction perpendicular or substantially perpendicular to the center axis;
a second impeller disposed coaxially or substantially coaxially with the first impeller and including a second hub centered on the center axis and a plurality of second blades disposed about the center axis outside the second hub in the radial direction;
first and second motors disposed in the first and second hubs and operable to rotate the first and second impellers about the center axis to create an airflow, respectively;
a hollow housing arranged to radially surround the first and second impellers; and
a plurality of first and second ribs arranged to connect and secure the first and second motors to the housing, respectively; wherein
the second impeller is disposed downstream of the first impeller in a direction of the airflow;
the first and second motors include first and second base portions to which the first and second ribs are connected, respectively, an opening of the first hub and an opening of the second hub are arranged opposite to one another, an average outer diameter of the first base portion being larger than a largest outer diameter of the first hub, an average outer diameter of the second base portion being smaller than a largest outer diameter of the second hub;
a radial thickness of the first hub and a radial thickness of the second hub both gradually increase in an axial direction such that radial outermost portions of the first hub and the second hub are aligned to define a straight line with a constant or substantially constant slope extending in the radial and the axial directions; and
a cross-sectional area of a region surrounded by an outer side surface of the second base portion and an inner surface of the housing is smaller than a cross-sectional area of a region surrounded by an outer side surface of the first base portion and the inner surface of the housing, when the axial fan unit is viewed along the center axis.

9. An axial fan unit according to claim 7, wherein each of the first and second base portions has a generally circular plate configuration.

10. An axial fan unit according to claim 1, wherein the housing includes first and second housing pieces radially surrounding the first and second impellers, respectively.

11. An axial fan unit according to claim 8, wherein the housing includes first and second housing pieces radially surrounding the first and second impellers, respectively.

12. An axial fan unit according to claim 1, wherein the first impeller and the second impeller rotate about the center axis in opposite directions relative to each other.

13. An axial fan unit according to claim 8, wherein the first impeller and the second impeller rotate about the center axis in opposite directions relative to each other.

14. An axial fan unit according to claim 1, wherein the first hub includes a first chamfered portion on an axial edge of the outer side surface of the first hub and the second hub includes a second chamfered portion on an axial edge of the outer side surface of the second hub.

15. An axial fan unit according to claim 8, wherein the first hub includes a first chamfered portion an axial edge of the outer side surface of the first hub and the second hub includes a second chamfered portion on an axial edge of the outer side surface of the second hub.

16. An axial fan unit according to claim 1, wherein
the first and second motors include first and second base portions, an average outer diameter of the first base portion being larger than a largest outer diameter of the first hub and an average outer diameter of the second base portion being smaller than a largest outer diameter of the second hub; and
the first base portion and the second base portion both include radial outermost portions that are arranged to extend substantially along the straight line with a constant or substantially constant slope extending in the radial and the axial directions.

17. An axial fan unit according to claim 8, wherein the first base portion and the second base portion both include radial outermost portions that are arranged to extend substantially along the straight line with a constant or substantially constant slope extending in the radial and the axial directions.

* * * * *